(12) United States Patent
Muranaka et al.

(10) Patent No.: US 7,249,289 B2
(45) Date of Patent: Jul. 24, 2007

(54) METHOD OF DECIDING ERROR RATE AND SEMICONDUCTOR INTEGRATED CIRCUIT DEVICE

(75) Inventors: Masaya Muranaka, Akishima (JP); Hideaki Kato, Ome (JP); Yutaka Ito, Ome (JP)

(73) Assignee: Elpida Memory, Inc., Tokyo (JP)

( * ) Notice: Subject to any disclaimer, the term of this patent is extended or adjusted under 35 U.S.C. 154(b) by 509 days.

(21) Appl. No.: 10/808,285

(22) Filed: Mar. 25, 2004

(65) Prior Publication Data
US 2004/0205426 A1 Oct. 14, 2004

Related U.S. Application Data

(62) Division of application No. 09/875,961, filed on Jun. 8, 2001, now Pat. No. 6,735,726.

(30) Foreign Application Priority Data
Jul. 10, 2000 (JP) .............................. 2000-207717

(51) Int. Cl.
*G06F 11/00* (2006.01)
(52) U.S. Cl. .............................. 714/48; 714/49; 714/54
(58) Field of Classification Search .................... 714/4, 714/48, 49, 52
See application file for complete search history.

(56) References Cited

U.S. PATENT DOCUMENTS

| | | | |
|---|---|---|---|
| 4,758,992 A | 7/1988 | Taguchi | 365/222 |
| 4,794,597 A | 12/1988 | Ooba et al. | 714/703 |
| 5,828,583 A * | 10/1998 | Bush et al. | 702/185 |
| 6,003,151 A * | 12/1999 | Chuang | 714/752 |
| 6,006,016 A * | 12/1999 | Faigon et al. | 714/48 |
| 6,065,146 A | 5/2000 | Bosshart | 714/754 |
| 6,236,602 B1 | 5/2001 | Patti | 365/201 |
| 6,560,725 B1 | 5/2003 | Longwell et al. | 714/54 |
| 6,647,517 B1 * | 11/2003 | Dickey et al. | 714/48 |

FOREIGN PATENT DOCUMENTS

| | | |
|---|---|---|
| JP | 07-262794 | 10/1995 |
| JP | 11-007760 A | 1/1999 |
| JP | 11-213659 | 8/1999 |

OTHER PUBLICATIONS

Mano, T.; Yamada, J.; Inoue, J.; Nakajima, S.; Circuit Techniques For A VLSI Memory, IEEE Journal of Solid-State Circuits, vol. 18 Issue: 5, Oct. 1983, pp. 463-470.

* cited by examiner

*Primary Examiner*—Scott Baderman
*Assistant Examiner*—Tim Bonura
(74) *Attorney, Agent, or Firm*—Miles & Stockbridge PC

(57) ABSTRACT

An error rate select circuit activated in an information sustaining mode is provided, wherein a plurality of pieces of data are read from a dynamic memory circuit and inspection bits which are used to detect an error existing in the pieces of data are generated. If no error is detected, a first predetermined value is added to a total value. If an error is detected, a second predetermined value greater than the first predetermined value is subtracted from the total value. If the total value exceeds a first set value, a refresh period is lengthened by a predetermined time increment. If the total value becomes smaller than a second set value, the refresh period is shortened by the predetermined time increment.

4 Claims, 17 Drawing Sheets

FIG. 9
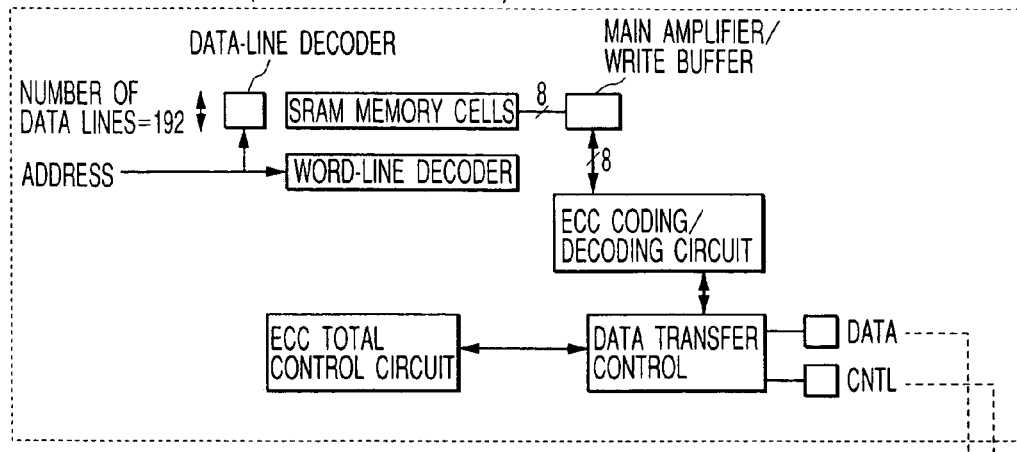
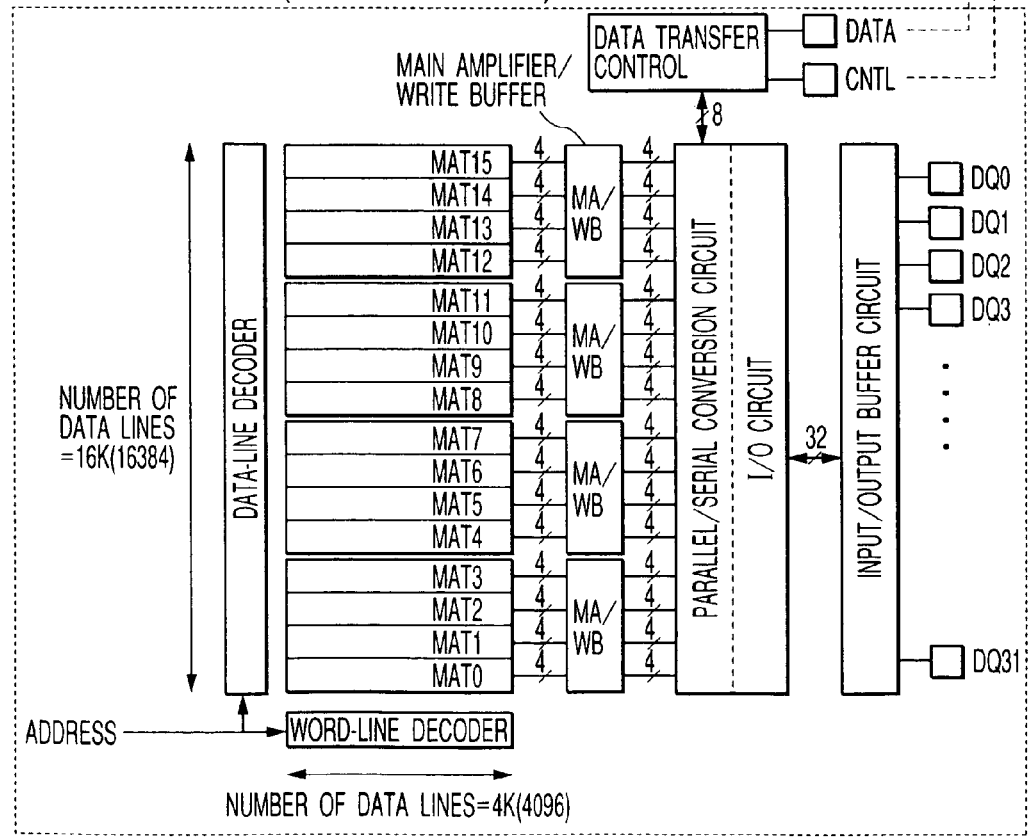

METHOD OF DECIDING ERROR RATE AND SEMICONDUCTOR INTEGRATED CIRCUIT DEVICE

CROSS-REFERENCE TO RELATED APPLICATION

This application is a division of application Ser. No. 09/875,961 filed Jun. 8, 2001 now U.S. Pat. No. 6,735,726.

BACKGROUND

In general, the present invention relates to a method of determining an error rate and a semiconductor integrated circuit device. More particularly, the present invention relates to an effective technology such as a data holding technology adopted in a memory circuit comprising dynamic memory cells.

As a result of a survey conducted after the present invention, Unexamined Patent Publication No. Hei 11(1999)-213659 and Unexamined Patent Publication No. Hei 7(1995)-262794 were identified. Referred to hereafter as prior art 1 and prior art 2 respectively, the former and latter publications are considered to be relevant to the present invention described later in this specification. Prior art 1 is a technology to control the frequency of refresh cycles by a CPU through execution of software using the number of erroneous rows detected by an error correction compound circuit in order to optimize intervals of refresh cycles of a DRAM in a sleep state. On the other hand, prior art 2 is a technology of detecting an error by means of an ECC circuit embedded in a DRAM and writing correction data into a memory cell.

SUMMARY OF THE INVENTION

However, descriptions of prior art 1 and prior art 2 do not include a suggestion to optimize an information holding time of each memory cell by monitoring an error rate at refresh cycles with a high degree of precision as is the case with the present invention to be described later.

There is no sufficient study of how to form a judgment on an erroneous row count detected by the error correction compound circuit to be used in controlling the frequency of refresh cycles as is the case with prior art 1. For example, let the refresh period be shortened immediately after the number of erroneous rows reaches an allowable limit in the course of a refresh operation. Assume that the number of erroneous rows disappears in a refresh operation of memory cells, which is carried out later. In this case, it is impossible to determine whether the number of erroneous rows disappears as a result of the shortening of the refresh period or the number of erroneous rows disappears due to the fact that the number of erroneous rows is concentrated at the beginning of a refresh operation. In other words, an erroneous row may possibly disappear in some cases even if the refresh period is not shortened as described above. If the refresh period is changed in the course of a refresh operation as described above, a result of error detection carried out on memory cells later on will be ignored. Thus, the memory cells' power to sustain data is not determined correctly.

In order to solve the problem described above, there is conceived a technique whereby the number of erroneous rows is compared with the allowable limit after the refresh operation is completed for all memory cells. If the number of erroneous rows is compared with the allowable limit after the refresh operation is completed for all memory cells, however, a problem caused by an erroneous row count far exceeding the allowable limit after the refresh operation can no longer be solved. As a result, the expected reliability of the error correction cannot be assured anymore.

In addition, prior art 2 does not include a concept of controlling the frequency of refresh cycles by using the number of erroneous, row's detected by an error correction compound circuit.

From a standpoint of power consumption reduction which is the original objective, in prior art 1, a question remains to be answered. To be more specific, the problem to be further studied is control of the frequency of refresh cycles using the number of erroneous rows detected by an error correction compound circuit. Such control is mainly implemented by execution of software by a central processing unit. In this configuration, in order to just sustain data stored in a DRAM, the CPU intervenes by generating an address and reads out as well as writes data from and into the address in the DRAM for a refresh cycle of the DRAM. Thus, the DRAM consumes a large power for outputting data to a system bus having a relatively large load-bearing capacity. In addition, a large power is also consumed by the CPU for driving an address bus having a large load-bearing capacity as well in an operation to output an address to the DRAM. Thus, in comparison with power consumption in the conventional self-refresh operation wherein only an internal circuit of the row system operates as driven by the DRAM itself, it is hardly thinkable that reduction of the frequency of refresh cycles using the number of erroneous rows detected by an error correction compound circuit is beneficial for a system including a DRAM mounted thereon.

It is thus an object of the present invention addressing the problems described above to provide a method of determining a data error rate with a high degree of reliability and to provide a semiconductor integrated circuit device having reduced power consumption for an operation to sustain information while assuring high reliability of a memory circuit comprising dynamic memory cells.

The above and other objects as well as novel features of the present invention will become more apparent from a careful study of the specification with reference to accompanying diagrams.

An outline of a representative of inventions disclosed in this specification is explained briefly as follows. An error rate of a plurality of pieces of data is determined by executing the steps of:

detecting an error in the pieces of data by using the pieces of data and additional inspection bits generated for the pieces of data;

accumulating first detection signals each indicating non-existence of an error to produce a total;

multiplying a second detection signal indicating existence of an error by a weight predetermined for an error rate to produce a product greater than each of the first detection signals; and subtracting the product from the total.

An outline of another representative of inventions disclosed in this specification is explained briefly as follows. A memory circuit comprising dynamic memory cells and having an information sustaining mode includes:

an ECC circuit activated in the information sustaining mode of the memory circuit in order to detect and correct an error by executing the steps of:

reading out a plurality of pieces of data stored in the memory circuit;

generating inspection bits for detecting and correcting an error in the pieces of data;

storing the inspection bits in an additional memory circuit; and reading out back the pieces of data and the inspection bits associated with the pieces of data in a predetermined refresh period, and an error rate select circuit for setting a refresh period by executing the steps of:

accumulating first detection signals each indicating non-existence of an error detected by the ECC circuit in a first direction to produce a total;

accumulating second detection signals each indicating existence of an error detected by the ECC circuit in a second direction to subtract a quantity from the total where the quantity is a product of the second detection signal and a weight and greater than each of the first detection signals; and increasing a refresh cycle by a predetermined time length for the total's value exceeding a predetermined width in the first direction or decreasing the refresh cycle by a predetermined time length for the total's value exceeding a predetermined width in the second direction.

BRIEF DESCRIPTION OF THE DRAWINGS

FIG. 9 shows a block diagram of an embodiment implementing a single semiconductor device obtained by combining the DRAM chip shown in FIG. 8 with the ECC chip shown in FIG. 7;

DETAILED DESCRIPTION

Figure 1:
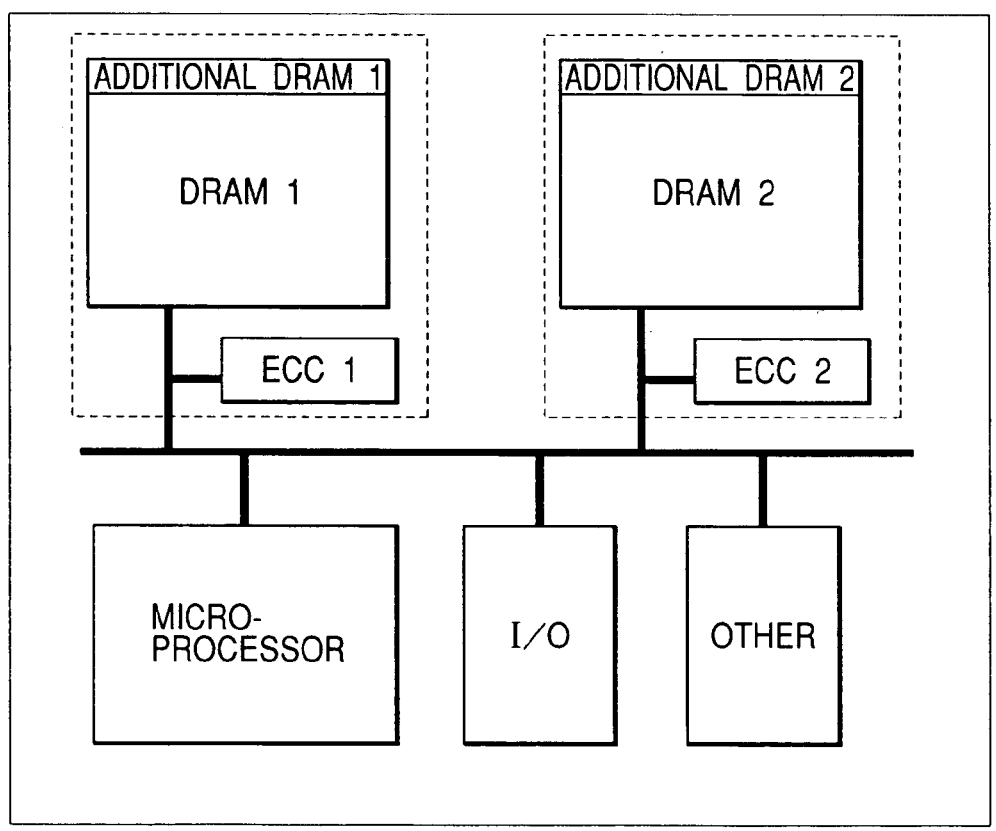
FIG. 1 shows a simple and plain block diagram of an embodiment implementing a system LSI provided by the present invention.

FIG. 1 shows the configuration of an embodiment implementing a system LSI provided by the present invention. Each circuit block shown in the figure is created on a single semiconductor substrate made of typically monocrystalline silicon by adoption of a generally known technology of manufacturing a semiconductor integrated circuit. The embodiment has embedded memory circuits including ordinary DRAM (Dynamic Random Access Memory) 1, ordinary DRAM 2, additional DRAM 1, additional DRAM 2, ECC (Error Checking and Correction) circuit ECC 1 and ECC circuit ECC 2, which are shown in the figure as representative memory circuits. In this embodiment, ordinary DRAM 1 and ordinary DRAM 2 form a pair. So do additional DRAM 1 and additional DRAM 2 as well as ECC circuit ECC 1 and ECC circuit ECC 2. Of course, it is also possible to provide only ordinary DRAM 1 or ordinary DRAM 2, additional DRAM 1 or additional DRAM 2 and ECC circuit ECC 1 or ECC circuit ECC 2. As an alternative, a common ECC circuit can be shared by the pair of ordinary DRAM 1 and ordinary DRAM 2 as well as the pair of additional DRAM 1 and additional DRAM 2.

When a microprocessor CPU informs ECC 1 and ECC 2 of a transition of this system LSI to a sleep mode, inspection codes of ECC 1 and ECC 2 for ordinary DRAM 1 and ordinary DRAM 2 respectively are written into additional DRAM 1 and additional DRAM 2 respectively prior to the transition to the sleep mode. The sleep mode is an information sustaining mode in which operations to read out data from the memory circuits and operations to write data into the circuits are not essentially carried out. Operations in the sleep mode will be explained in detail later.

Even while read and/or write operations are being carried out, in a dynamic memory cell, there is performed a refresh operation wherein a stored charge is read out and written back in the original state during a predetermined period. A refresh operation carried out between read and/or write operations is different from an operation in the information sustaining mode. In a refresh operation of a dynamic memory cell in the sleep state, besides error detection and correction carried out by ECC 1 and ECC 2 using inspection codes, an error rate is determined in accordance with an error rate determining method provided by the present invention so that the refresh cycle is optimized to a value appropriate for a data sustaining period of the memory cell.

This system LSI is also provided with a plurality of circuit blocks in addition to the memory circuits such as DRAM 1 and DRAM 2. Each used for implementing a demanded function, the circuit blocks include, among others, an input/output circuit which is referred to hereafter as an I/O. The other circuits include a read-only memory referred to hereafter as a ROM, a D/A converter referred to hereafter as a DAC, an A/D converter referred to hereafter as an ADC, an interrupt control circuit referred to hereafter as an INC, a clock generator referred to hereafter as a CKG, a static memory referred to hereafter as an SRAM and a DMA controller referred to hereafter as a DMAC.

The system LSI shown in the figure is called an ASIC (Application Specific Integrated Circuit), that is, an IC (Integrated Circuit) designed into a configuration customized for a specific application. In other words, most of the circuit blocks shown in the figure are each the so-called module or the so-called macro cell, which serves as an independent circuit functional unit so that an ASIC configuration can be constructed with ease. The size and the configuration of each circuit functional unit can be corrected. In the case of an electronic system implemented as an ASIC, any one of circuit blocks shown in the figure that is not required by the electronic system can be dismounted from the semiconductor substrate. On the other hand, a circuit block required for implementing a functional unit but not shown in the figure can be added.

No details of a microprocessor referred to hereafter as a CPU are shown in the figure. Anyway, the CPU comprises internal components such as an instruction register, a microinstruction ROM for decoding an instruction stored in the instruction register and generating microinstructions and control signals in accordance with a result of decoding, a processing circuit, general registers, a bus driver connected to an internal bus and input/output circuits (I/O) including a bus receiver. In short, the CPU reads out instructions from typically the ROM and carries out operations in accordance with the instructions.

The CPU also takes in external data received through the I/O, extracting some data such as constants required in execution of instructions read out from the ROM. The CPU also supplies data to the DAC to be subjected to D/A conversion, reads out data obtained as a result of A/D conversion carried out by the ADC, reads out data from as well as writes data into the SRAM, DRAM 1 and DRAM 2 and controls the operation of the DMAC. The internal bus includes control lines used by the CPU for controlling the circuit blocks shown in the figure and control lines used for informing the CPU of status of the circuit blocks including the DMAC. In addition, the CPU refers to an operation control signal set typically in a command register employed in the INC through the internal bus in order to carry out necessary processing. The CPU also operates at a period and with operation timings, which are determined by a system clock signal generated by the CKG.

Main internal components of the CPU are CMOS circuits or, to be more specific, circuits comprising P-channel MOSFETs and N-channel MOSFETs. To put it in detail, CMOS circuits composing the CPU include a CMOS static logic circuit, a CMOS static circuit and a CMOS dynamic circuit, which are not shown in the figure. The CMOS static circuit is capable of performing static operations as a CMOS static flip-flop does. The CMOS dynamic circuit outputs an electric precharge and a system clock signal to signal output nodes synchronously with a system clock signal. It should be noted, however, that the CMOS circuits composing the CPU are not limited to those described above.

The CPU puts its operation in a halt state when the CKG no longer supplies the system clock signal. In the halt state, a signal output by the dynamic circuit inevitably changes in an undesirable manner due to an undesirable leak current generated in the circuit. On the other hand, data is retained as it is in a circuit such as a register having a configuration comprising static flip-flop circuits even when the CKG no longer supplies the system clock signal to the circuit.

In a period wherein the CKG does not supply the system clock signal, signal level transitions at a variety of nodes of the static circuit in the CPU are halted. In addition, discharge and precharge operations at output nodes of the dynamic circuit in the CPU are also stopped as well. A relatively large consumed current such as an operating current consumed by the CMOS circuits in this state is virtually zero. The consumed current is charge and discharge currents which are given from power supply wires so as to induce signal displacements to stray capacitance and parasitic capacitance of wires connected to a variety of nodes. As a result, the CPU is in a state of low power consumption wherein only a small current typically equal in magnitude to a leak current. In such a halted operation state of the CPU, DRAM 1 and DRAM 2 are put in an information sustaining mode (or a sleep mode).

Receiving an external clock signal from an external pin, the CKG generates a system clock signal with periods corresponding to the external clock signal. The generation of the system clock signal by the CKG is controlled by an initial operation command signal control signal and a mode signal responding to an operation control signal from the INC in addition to a control signal generated by the CPU. If a standby operation is requested by the operation control signal, the CPU issues a command to DRAM 1 and DRAM 2 to enter a sleep mode. Responding to this command, DRAM 1 and DRAM 2 transit to a sleep mode using ECC 1 and ECC 2, which have been described earlier. In addition, DRAM 1 and DRAM 2 also carry out refresh operations using ECC 1 and ECC 2, which will both be described later. Processing to transit to such a standby operation is carried out. Then, the CPU outputs a control signal to the CKG to halt the operation to generate the system clock signal.

When an operation is requested by an operation control signal generated typically in the event of an interrupt, the CPU carries out necessary processing to transit the requested operation in the same way as the standby operation.

The I/O receives a signal from an external source through a predetermined external pin. The I/O also outputs a signal received from the internal bus to a predetermined external pin. The I/O includes control registers each comprising a CMOS static circuit. Any one of the control registers can be selected by the CPU. The CPU is also capable of giving control data for the I/O to a selected control register. Examples of the control data are a data I/O command and a high-impedance state command. Data registers employed in the I/O are each used for transferring data between external pins and the internal bus. The bit count of the external terminal, that is, the number of pins, may be different from the bit count of the internal bus. In this case, the data register carries out bit-count transformation to adjust the smaller bit count to the greater bit count in accordance with control executed by the CPU.

Assume for example that the number of pins in the external terminal is 64 and the bit count of the internal bus is 0.256, which is a relatively a large number. In this case, data being supplied sequentially from the external terminal in 64-bit units to the internal bus by way of the data register is transformed into 256-bit data by the data register in accordance with serial-to-parallel data transformation control executed by the CPU. The 256-bit data is then supplied in parallel to the internal bus. On the other hand, 256-bit data being supplied in parallel from the internal bus to the external terminal by way of the data register is transformed into 64-bit data units by the data register in accordance with parallel-to-serial data transformation control executed by the CPU. The 64-bit data units are then supplied sequentially to the external terminal. The input operation of I/O's circuit for receiving input signals and the output operation of the I/O's circuit for generating output signals are controlled by the system clock signal. Thus, when the I/O no longer receives the system clock signal, the I/O enters a low power consumption state in the same way as the CPU does as described above.

Each dynamic memory cell of DRAM 1, DRAM 2, additional DRAM 1 and additional DRAM 2 typically comprises only few devices such as an information accumulating capacitor and a select MOSFET, to result in a relatively small memory cell size. The information accumulating capacitor is used for holding information in the form of electric charge. Therefore, a large-capacity memory comprising such dynamic memory cells can be made relatively small even if the storage capacity of the memory is large.

Figure 2:
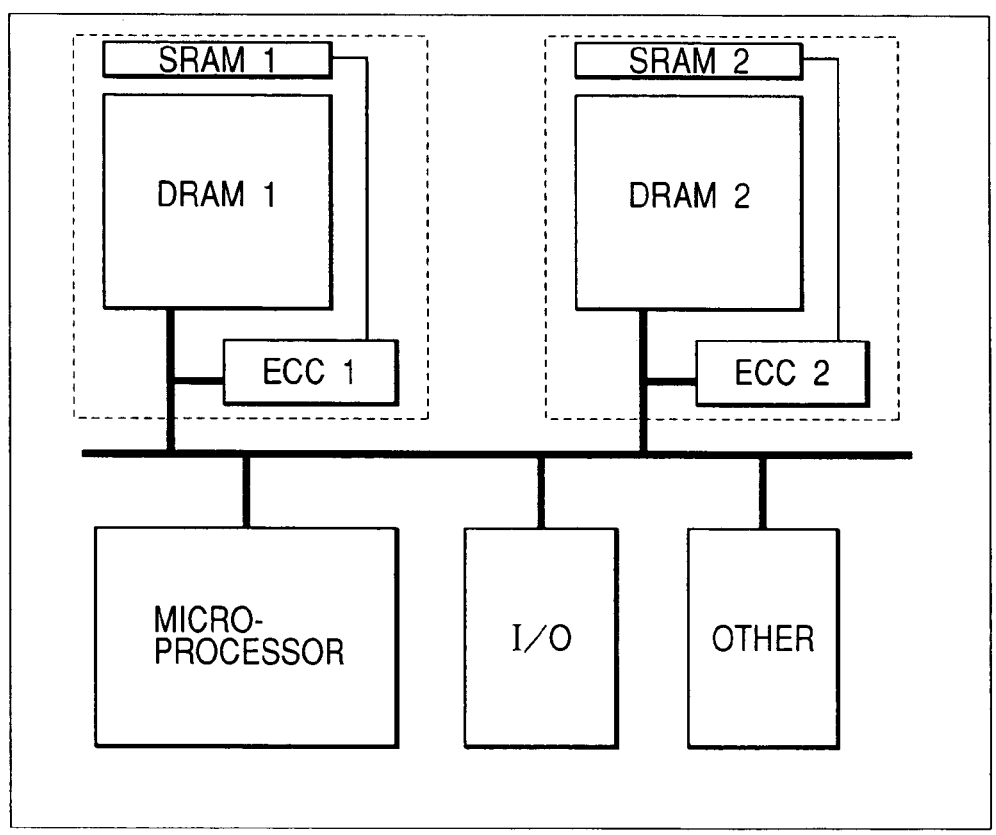
FIG. 2 shows a simple and plain block diagram of another embodiment implementing a system LSI provided by the present invention.

FIG. 2 is a block diagram simply and plainly showing another embodiment implementing a system LSI to which the present invention is applied. In this other embodiment, memory areas for storing ECC inspection bits in the embodiment shown in FIG. 1 are each changed to an SRAM. The rest of the configuration is identical with the embodiment shown in FIG. 1. In an SRAM used as a memory area for storing inspection bits in this way, a refresh operation is not required for the memory area for storing inspection bits. In particular, if the LSI system is divided into 2 chips for accommodating DRAM and ECC units respectively and the 2 chips are mounted on the same package, the DRAM chip is used as a general-purpose DRAM and the ECC chip is an SRAM used as a memory area for storing inspection bits. Thus, a control operation in the ECC chip becomes simple.

Figure 3:
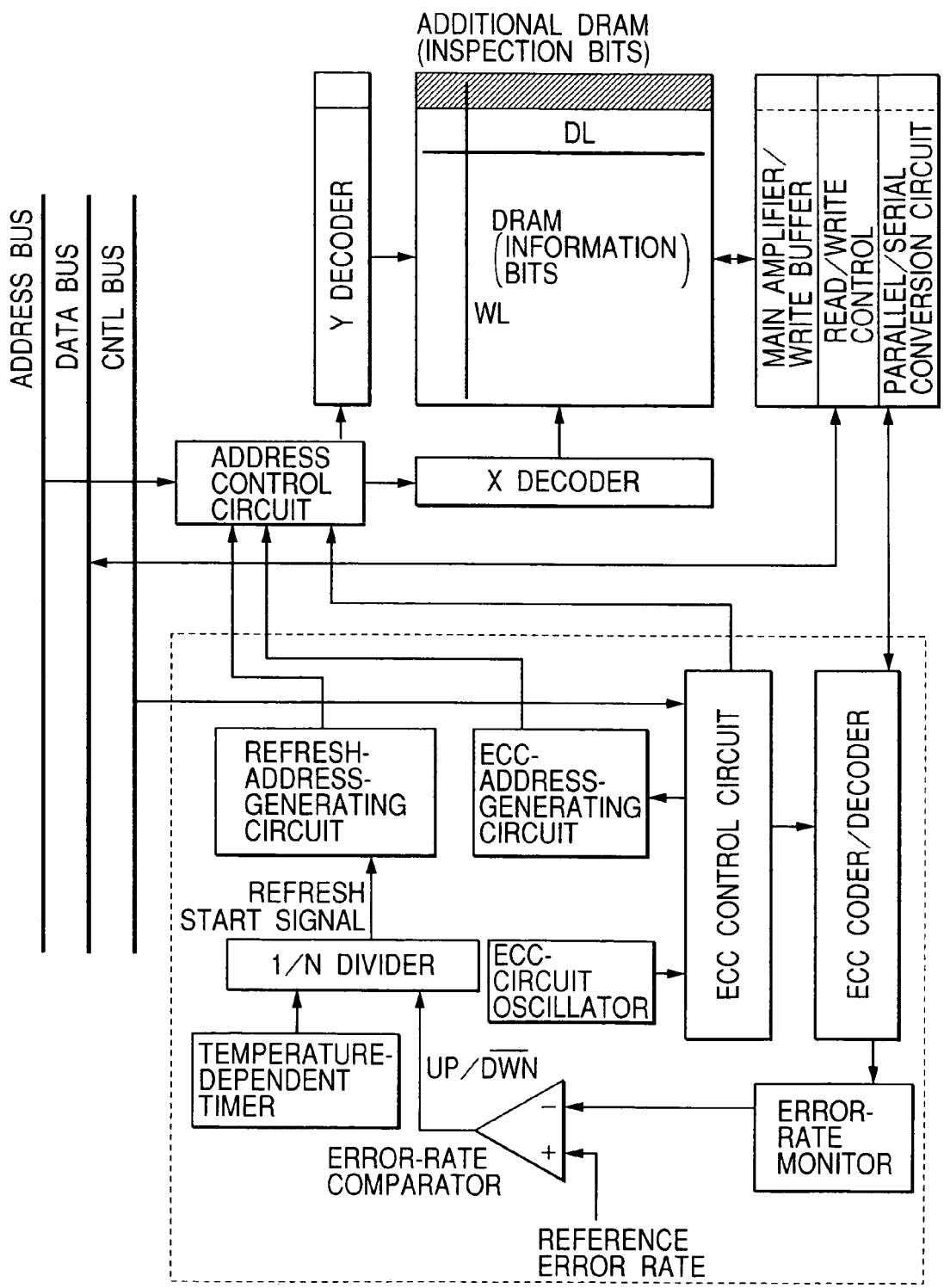
FIG. 3 shows a detailed block diagram of an embodiment implementing a memory circuit (or a DRAM) employed the system LSI shown in FIG. 1.

FIG. 3 is a detailed block diagram showing an embodiment implementing the DRAM memory circuit shown in FIG. 1. The memory circuit implemented by this embodiment basically comprises 3 configuration elements. The first configuration element is a DRAM unit serving as the core of the memory circuit. The DRAM unit comprises a DRAM, an additional DRAM, an X decoder, a Y decoder and a read/write control unit for carrying out operations to input and output data. The second configuration element is a refresh control unit comprising a refresh address generating circuit, a 1/N frequency divider and a temperature-dependent timer. The third configuration element is an ECC control unit comprising an ECC activation timer, an ECC address generating circuit, an ECC encoder-decoder, an error rate monitor and an error rate comparator. The error rate monitor is used for monitoring the rate of error correction carried out by the ECC encoder-decoder. In addition, the memory circuit includes an address control circuit and an I/O control circuit.

Normally, the DRAM area of the DRAM unit is used for storing information bits. On the other hand, the additional DRAM area of the DRAM unit is used for storing inspection bits. A refresh operation is carried out simultaneously for the DRAM and additional DRAM areas. Such a simultaneous refresh operation is possible because the DRAM and the additional DRAM share common word lines WL. The read/write control unit comprises a main amplifier for amplifying a read signal, a write amplifier for generating a write signal, a control circuit and a parallel/serial conversion circuit serving as an interface with the ECC unit.

The parallel/serial conversion circuit converts information comprising typically 64 bits read out in parallel from the DRAM area into 8-bit units supplied sequentially to the ECC encoder-decoder employed in the ECC unit. On the other hand, serial data including inspection bits generated by the ECC encoder-decoder employed in the ECC unit is transformed into a 64-bit unit stored as parallel information completing error correction. Inspection bits are read out from and written into the additional DRAM in the same way. The configuration of the DRAM unit is described later in detail.

In a sleep state, the refresh control unit refreshes the DRAM unit at a period N times the period of a signal generated by the temperature-dependent timer. The N-time period is the period of a signal generated by the 1/N frequency divider. The refresh address generating circuit generates refresh addresses of a refresh operation. The ECC control unit issues a command to change the value of N in accordance with an error rate determining method provided by the present invention. The value of N is properly changed to give an optimum refresh period. Control to optimize the refresh period will be explained in detail in a description of the ECC control unit.

The ECC control unit has 3 main functions. The first function is a function of carrying out an operation to write an ECC inspection code for information bits stored in the DRAM area into the additional DRAM area right after a transition to a sleep mode. The second function is a function of carrying out detection and correction of an error for all areas by using information bits stored in the DRAM area and ECC inspection bits stored in the additional DRAM area and associated with the information bits when the mode is restored to the normal mode from the sleeping mode. With the third function, an ECC activation timer generates a periodical activation signal based on oscillation pulses output by an ECC circuit oscillator in a sleep state. The activation signals each trigger detection and correction of an error by using information bits stored in the DRAM area and ECC inspection bits stored in the additional DRAM area and associated with the information bits. The detection and correction of an error moves from one area to another each time an activation signal is generated.

The period of the activation signal and the size of a DRAM area subjected to a one-time detection and correction of an error will be described later in detail. To make the description easy to understand, typically, a fraction of the entire information bits is subjected to detection and correction of an error in one second.

The error rate monitor monitors a ratio of the number of error-corrected bits to the total number of information bits. For example, assume that 1 bit is error-corrected in error detection and correction of a 1/1,000 of the total area for storing-information bits. In this case, the error rate is said to be 0.1%. This is because distribution of real capabilities of holding data or distribution of sustainable data times in the array of memory cells is random as is generally known.

In other words, any area subjected to detection and correction of an error can be regarded as a representative as the entire DRAM area. If the error correction power of the ECC unit is greater than 0.1%, the division ratio N of the frequency divider employed in the refresh control unit is increased to lengthen the refresh period. With the error correction power of the ECC unit taken as a reference error rate, the division fraction N is increased while the ECC error rate is being monitored. That is, the refresh period is increased till the monitored ECC error rate becomes equal to the reference error rate.

If the error correction power of the ECC unit is smaller than the monitored error rate, on the other hand, the division ratio N of the frequency divider employed in the refresh control unit is decreased to shorten the refresh period. While the ECC error rate is being monitored, the refresh period is adjusted finely to give an optimum refresh period matching the memory cells' real capabilities of holding data or the sustainable data times of the memory cells. Thus, even if the memory cells' real capabilities of holding data or the sustainable data times of the memory cells vary due to a change in temperature as expected, the refresh cycle is adjusted automatically. In addition, the temperature dependence of the temperature-dependent timer does not have to be as strict as the conventional product including a refresh function of a temperature following type.

Figure 4:
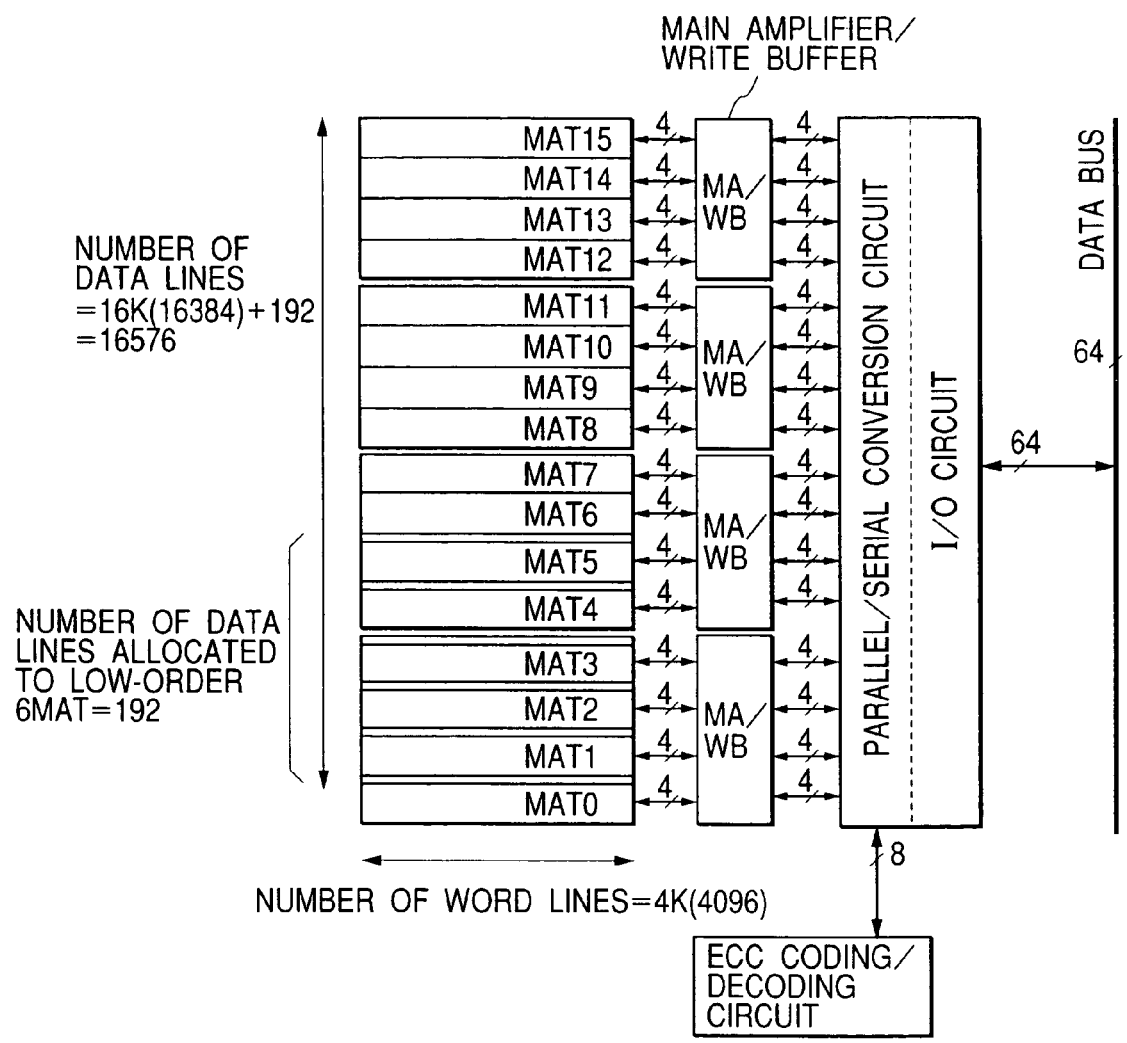
FIG. 4 shows the configuration of a DRAM unit for the embodiment shown in FIG. 1.

FIG. 4 is a diagram showing the configuration of an embodiment implementing the DRAM unit employed in the embodiment shown in FIG. 1. The total number of bits in the DRAM unit is 64M (mega) bits. The number of word lines is 4,096 and the number of data lines is 16,384. The memory cell array is divided into 16 memory mats, namely, MAT 0 to MAT 15. Each of MAT 0 to MAT 15 can be accessed in an operation to write or read out 4-bit data at the same time. Since MAT 0 to MAT 15 can be accessed simultaneously, 64-bit data can be written or read out at the same time in parallel.

The ECC unit employed in this embodiment adopts a BCH double error correction code method whereby 24 inspection bits are added to 2,048 information bits. It should be noted, however, that another error correction technique can be adopted. Thus, the organization code length is 2,072 bits with a redundancy of 1.17% (=24/2,072). In other words, the ratio of an area occupied by the additional DRAM to the entire area is merely 1.17%. The additional DRAM for storing the ECC inspection bits described above is distributed to 6 of the 16 mats, namely, MAT 0 to MAT 5. That is, only portions of MAT 0 to MAT 5 are allocated to the additional DRAM. Each of MAT 0 to MAT 15 is provided with 32 data lines for the ECC inspection bits. Thus, there is a total of 32×6=192 data lines. The figure does not show inspection-bit main amplifiers (MAs) including write amplifiers. As a result, a word line includes 8 organization codes. Data is exchanged with the ECC encoder-decoder in 8-bit units. Thus, the code length of 2,078 bits is transmitted 258 (=2,078/8) times.

Figure 5:
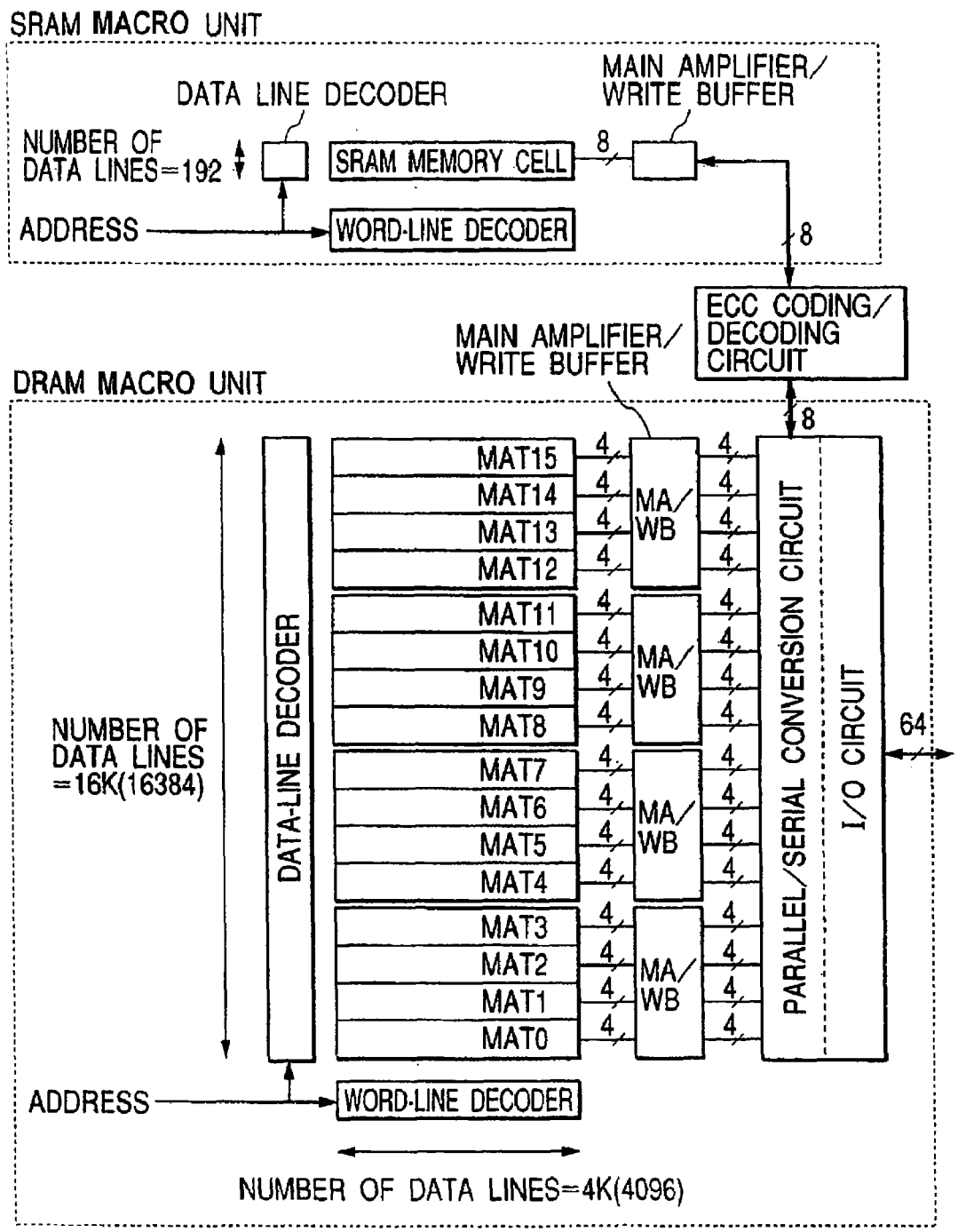
FIG. 5 shows the configurations of a DRAM unit and an SRAM unit, which are provided for the embodiment shown in FIG. 2.

FIG. 5 is a diagram showing the configuration of an embodiment implementing an SRAM macro unit and a DRAM macro unit, which are employed in the embodiment shown in FIG. 2. Much like the DRAM described previously, the total number of bits in the DRAM macro unit is 64M (mega) bits. The number of word lines is 4,096 and the number of data lines is 16,384. The memory cell array is divided into 16 memory mats, namely, MAT 0 to MAT 15. Each of MAT 0 to MAT 15 can be accessed in an operation to write or read out 4-bit data at the same time. Since MAT 0 to MAT 15 can be accessed simultaneously, 64-bit data can be written or read out at the same time in parallel.

The SRAM macro unit for storing inspection bits is provided with 192 data lines and 4,096 word lines. A data line decoder selects 8 of the 192 data lines at one time. The 8 selected data lines are supplied to a main amplifier and a write amplifier to make an access to the memory in 8-bit units. There is also provided a word line decoder for generating a signal for selecting word lines. The data line decoder and the word line decoder receive an address for selecting data lines and word lines respectively.

An ECC decoding-encoding circuit is provided for the DRAM macro unit and the SRAM macro unit. Data is exchanged with each of the DRAM macro unit and the SRAM macro unit in 8-bit units. That is, as described previously, when entering the information sustaining mode described earlier, the ECC encoding-decoding circuit reads out 2,048 bits from the DRAM macro unit, and adds 24 inspection bits to the 2,048 bits to generate an organization code. The ECC encoding-decoding circuit then writes the inspection bits into the SRAM macro unit. The ECC encoding-decoding circuit detects and corrects an error for each organization code in a refresh operation having a fixed period in order to sustain information.

Figure 6:
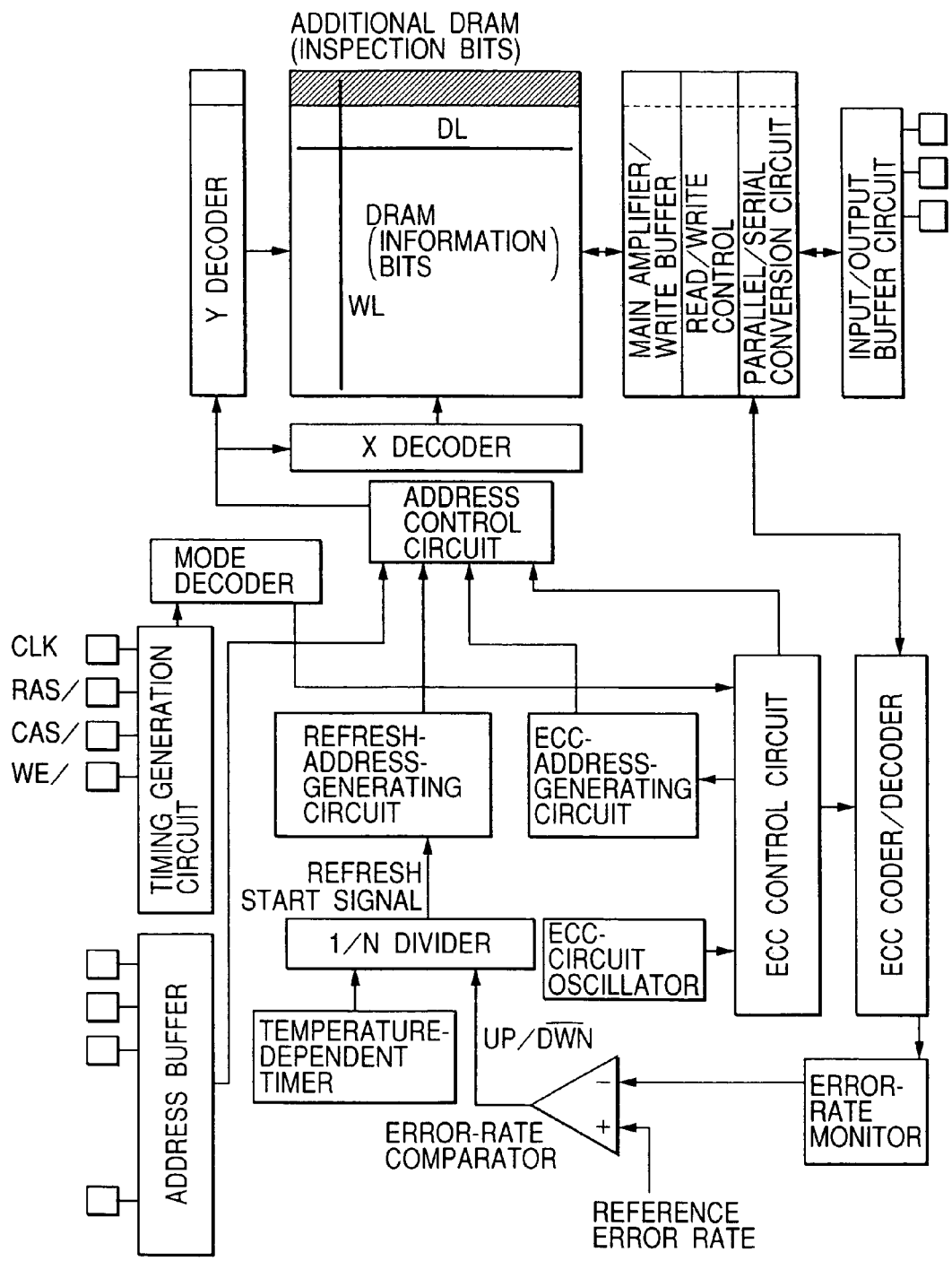
FIG. 6 shows a block diagram of an embodiment of applying the present invention to a dynamic RAM.

FIG. 6 is a block diagram showing an embodiment implementing the present invention applied to a dynamic RAM (DRAM). To be more specific, unlike the DRAM memory circuit mounted on a system LSI as shown in FIG. 1, the figure is a detailed block diagram showing an embodiment implementing the present invention applied to a standalone DRAM. The DRAM implemented by this embodiment is basically identical with the DRAM memory circuit shown in FIG. 3. A DRAM unit serving as a first core is provided with an address buffer, a timing generation circuit and an I/O buffer circuit, which serves as substitutes for an address bus, a data bus and a control bus like those of the system LSI described earlier.

The address buffer has external pins for receiving address signals. The timing generation circuit is also provided with external pins for receiving a clock signal CLK, a row-address strobe signal RAS/, a column-address strobe signal CAS/ and a write enable signal WE/. In addition, the I/O buffer also has external pins for outputting read signals and inputting write signals.

The embodiment can be applied suitably to a synchronous DRAM having external pins for receiving write signals in a write operation, outputting read signals in a read operation as well as receiving address signals and control signals in write and read operations synchronously with the clock signal CLK. It should be noted, however, that the synchronous DRAM is merely a typical application. The embodiment includes a mode decoder. The mode decoder distinguishes a normal operation and an information sustaining mode from each other, generating a control signal for activating the ECC unit in the information sustaining mode.

The refresh address generating circuit generates a refresh address signal in an information sustaining mode with a period different from that of a normal operation. It should be noted, however, that this scheme is typical. That is, a refresh operation is carried out in a normal operation at a short period to give a sufficient time margin so that information stored in memory cells is not lost. In an information sustaining mode, on the other hand, a refresh operation is carried out in at a sufficiently long period according to the output of the error rate comparator by using the error correcting function of the ECC unit as described earlier.

Figure 7:
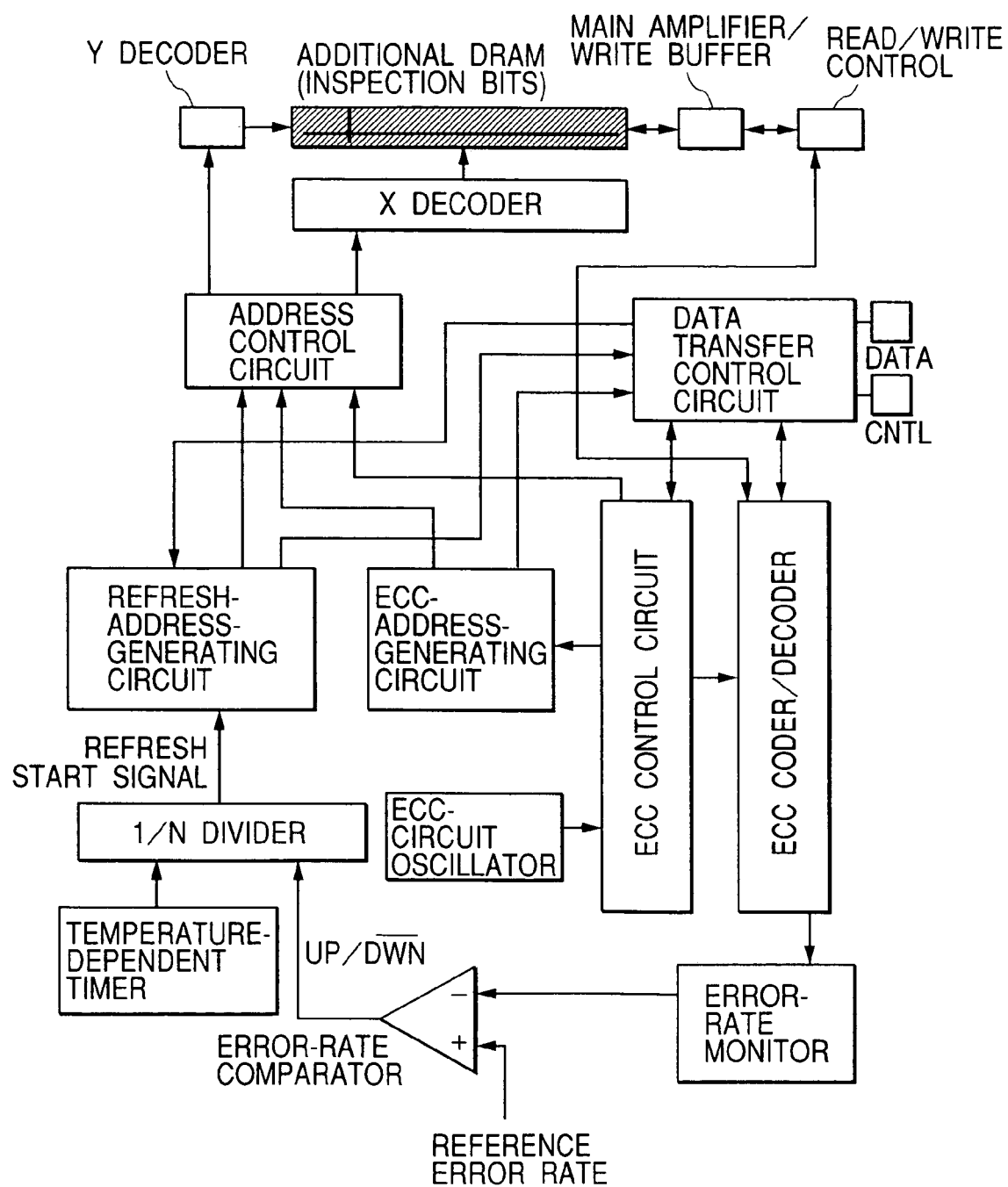
FIG. 7 shows a block diagram of an embodiment implementing an ECC unit used in the present invention in a single semiconductor chip.

FIG. 7 is a block diagram showing an embodiment implementing the ECC unit described above in a single semiconductor chip. That is, the embodiment is a semiconductor integrated circuit device comprising the additional DRAM and the ECC unit excluding the DRAM unit serving as the core. The semiconductor chip containing the ECC unit is combined with a general-purpose DRAM chip to be explained later by referring to FIG. 8, being accommodated in a single package. In this way, it is possible to implement a semiconductor storage device having the same function as the embodiment shown in FIG. 6.

With the ECC unit implemented in a chip separated from the DRAM unit as described above, data is exchanged between the DRAM unit and the ECC unit in 8-bit units as described earlier. In this case, the number of dedicated pins or pads unavoidably increases and the power consumption also rises accordingly. In order to solve this problem, the embodiment is provided with a data line transfer control circuit wherein a data pad DATA and a control pad CNTL are used for inputting and outputting data serially.

Figure 8:
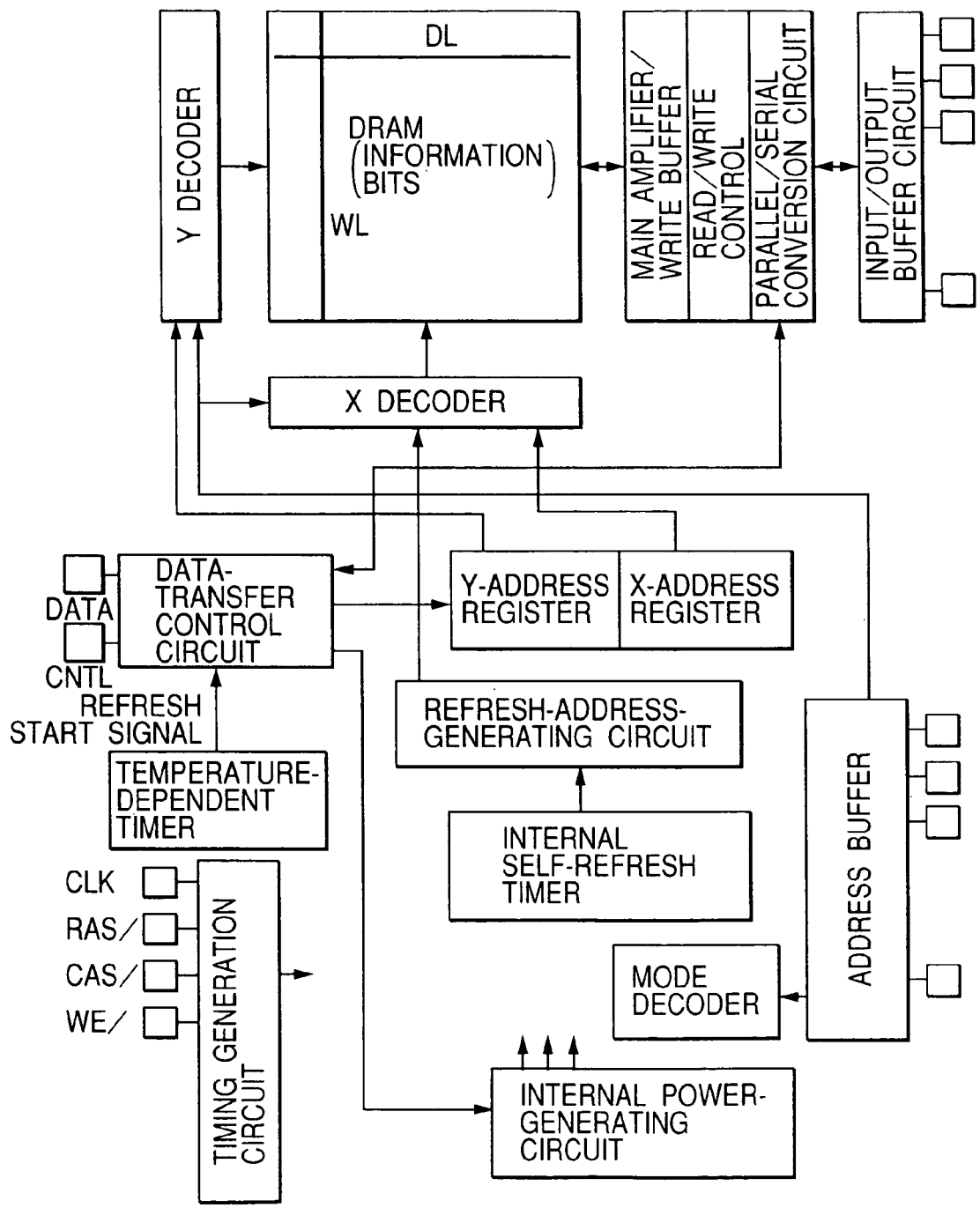
FIG. 8 shows a block diagram of an embodiment implementing a DRAM chip combinable with the ECC chip shown in FIG. 7.

FIG. 8 is a block diagram showing an embodiment implementing a DRAM chip which can be combined with the ECC chip shown in FIG. 7. The DRAM chip is a general-purpose DRAM chip having some additional circuits including a data pad DATA and a control pad CNTL, which are used for exchanging data with the ECC chip, a data transfer control circuit, an X address register and a Y address register. A refresh address generating circuit and an internal self-refresh timer are used for carrying out refresh operations at a short period by considering a data sustaining characteristic for a worst case in memory cells in the same way as the commonly known DRAM.

Thus, the DRAM chip is a semiconductor storage device in its own right. That is, the basic function of this DRAM chip is identical with that of the general-purpose DRAM chip. If this DRAM chip is combined with the ECC chip shown in FIG. 7, it is possible to implement the same function as a DRAM having an ECC unit as shown in FIG. 6. As described above, this configuration comprises simple circuits such as a general-purpose DRAM chip, a data pad DATA and a control pad CNTL, which are used for exchanging data with the ECC chip, a data transfer control circuit, an X address register and a Y address register. The simple circuits allow the semiconductor storage device to be used in 2 different ways, promoting mass production. As a result, the cost can be reduced due to the mass production.

In the information sustaining mode, a refresh operation is carried out not at a short period determined by the embedded internal self-refresh timer and the embedded refresh address generating circuit, but at the aforementioned long period informed by the ECC by way of a data transfer control circuit. With the ECC chip and the DRAM chip created separately, the temperature of the former is not necessarily the same as the latter. Thus, by employing a temperature-dependent timer in the DRAM chip to be used for carrying out a refresh operation according to temperature dependence of memory cells, it is possible to solve a problem caused by a temperature discrepancy. Note that it is desirable to utilize the temperature-dependent timer to provide the internal self-refresh timer with temperature dependence.

FIG. 9 shows a block diagram of a semiconductor storage device implementing a combination of the DRAM chip shown in FIG. 8 and the ECC chip shown in FIG. 7. As shown in FIG. 9, the DRAM (information bit) unit serving as the main body is connected to the external ECC (inspection bit) unit through data transfer control circuits for serially transferring data as described earlier. The semiconductor storage-device shown in FIG. 9 has basic functions identical with those of the embodiment shown in FIG. 6 except that, in the case of the embodiment shown in FIG. 6, data is transferred between the DRAM unit and the ECC unit in 8-bit units. It should be noted that, in this embodiment shown in FIG. 9, the external ECC unit employs SRAM memory cells each used for storing an inspection bit. As such, inspection bits can be stored in a DRAM like the embodiment shown in FIG. 7 or in an SRAM as is the case with of the embodiment shown in FIG. 6.

Figure 17:
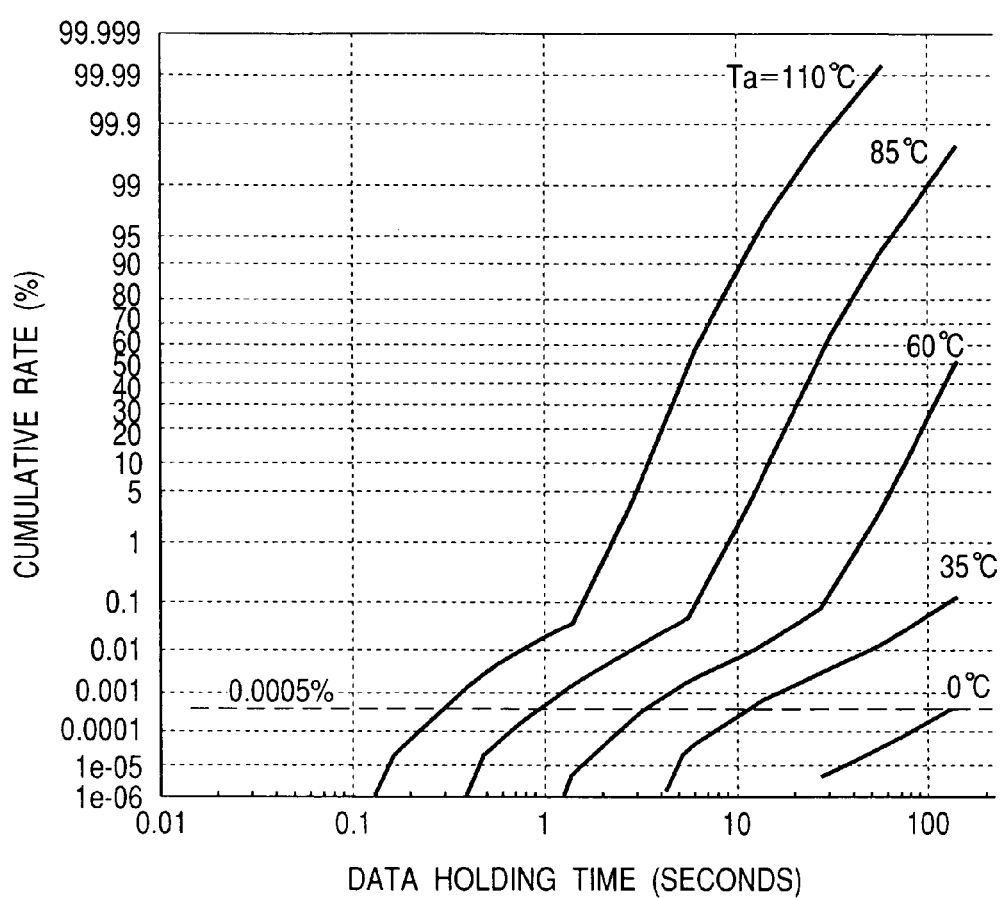
FIG. 17 shows characteristics representing a cumulative rate of data sustaining times of an ordinary dynamic memory cell used for explaining the present invention.
Figure 18:
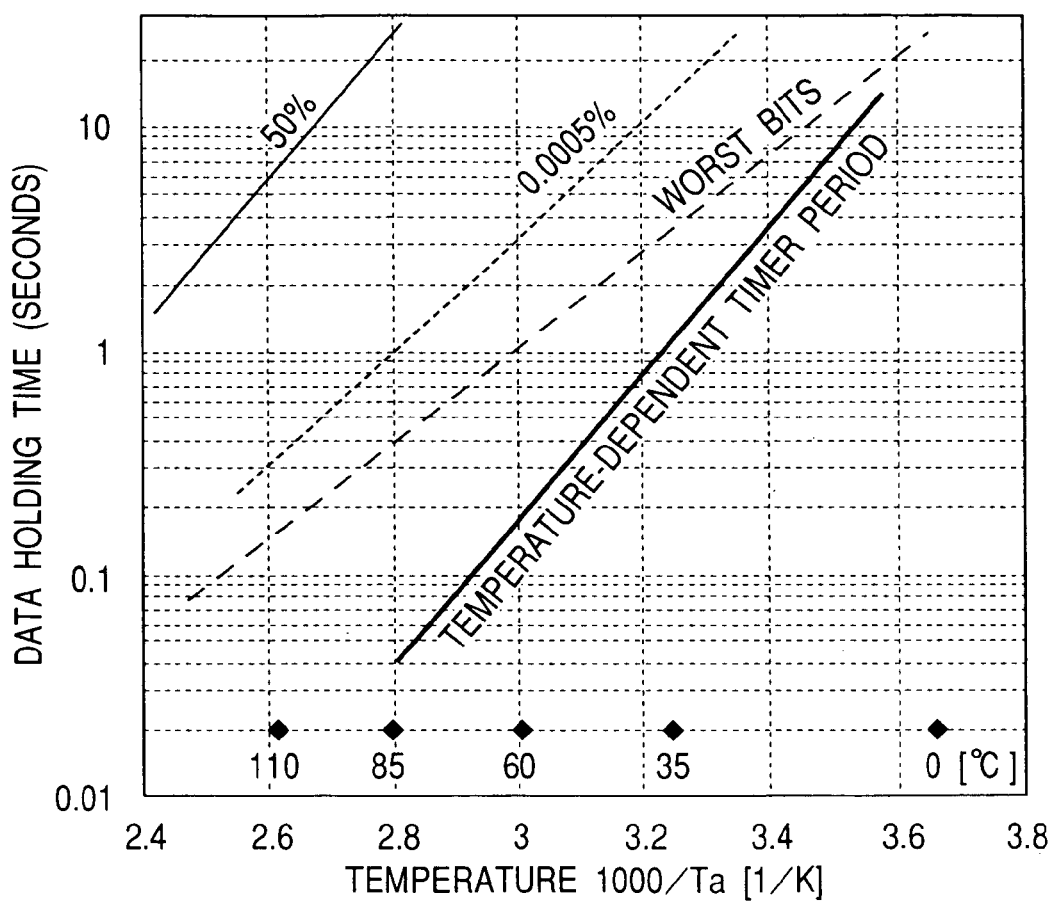
FIG. 18 shows characteristics representing temperature dependence of the data sustaining time for fixed cumulative frequencies shown in FIG. 17.

FIG. 17 shows characteristics each representing a relation between a cumulative rate and a data holding time of an ordinary dynamic memory cell at a temperature. FIG. 18 shows characteristics each representing a relation between a data holding time and a temperature of an ordinary dynamic memory cell for a cumulative rate. In the characteristic diagram of FIG. 18, the temperature dependence of the temperature-dependent timer is made the same as the temperature dependence in the neighborhood of a cumulative rate of 50% by assuming that the same pn junction as the memory cells is used. By the way, it is obvious from the characteristic diagram that the follow-up characteristic of the period of the time-dependent timer with respect to the temperature dependence of the worst bit is poor. On the other hand, the error correction power of this embodiment is 2 bits in 2,072 bits as is the case with the embodiment described previously. Thus, if worst comes to worst, there may be a fatal defect caused by 3 or more erroneous bits existing in the organization code.

Assume that 0.0005% of the total number of bits is erroneous bits. For example, 200K (kilo) bits include 1 erroneous bit or 64M (mega) bits include about 350 erroneous bits. Even at an extremely low error rate of 0.0005%, from a probability point of view, 3 or more erroneous bits exist in an organization code. Assume that erroneous bits are distributed at complete random. In this case, at an error rate of 0.0005%, the probability of existence of 3 or more erroneous bits in an organization code is about 2E−7=0.2 ppm. From the semiconductor memory reliability point of view, this probability is sufficiently low.

A relation between the operation period of the error rate monitor and the refresh period is explained in detail as follows. Assume a 64-bit DRAM (having 4K word lines×16 K data lines) like the embodiment described earlier as an example. An error rate of 0.0005% means that 200 kilobits include 1 erroneous bit as described above. That is, 64 megabits include about 336 erroneous bits. At an error rate of 0.001%, on the other hand, 100 kilobits include 1 erroneous bit and 64 megabits include about 672 erroneous bits.

As shown in FIG. 17, at an ambient temperature of 35 degrees C., the refresh interval is about 10 seconds. The refresh interval is a data holding time allowing an error rate of 0.0005% where the error rate is defined as a ratio of the number of erroneous bits generated during the interval to the total number of stored bits. Keeping the error rate at 0.0005% can be said to be always maintaining the number of erroneous bits in 200 kilobits at 1 on the average. At a refresh interval of 10 seconds, in the configuration of the embodiment, a refresh operation is carried out for each word at intervals of 2.4 ms (=10/4,096). Since 200 kilobits correspond to information on about 12 (=200K/16K) word lines, 1 erroneous bit is generated in a period of 30 ms (=2.4 ms×12) on the average.

That is, while a refresh operation is being carried out at intervals of 2.4 ms, data is read out from refreshed word lines and subjected to ECC (error checking and correction) in 12 word line units each corresponding to 30 ms to verify whether the error rate is below a fixed value of 0.0005%. In addition, even for an abrupt change in temperature, a monitoring interval of 30 ms has sufficient responsiveness. While the refresh operation and the read operation are explained separately, in actuality, by performing a read operation, a refresh operation is carried out at the same time. In addition, even though ECC (error checking and correction) is carried out in 12 word line units each corresponding to 30 ms, in actuality, errors on 12 word lines corresponding to retroactive 30 ms are monitored continuously.

Next, the configuration of the error rate monitor and an error rate determining method are explained in concrete terms.

The operations of the error rate comparator and the 1/N frequency divider are explained as follows. An error rate of 0.0005% means that 200 kilobits include 1 erroneous bit on the average as described above. In this embodiment, the length of an organization code is 2,072 bits. Thus, 200 kilobits comprise about 100 organization codes. That is, 100 organization codes can be said to include an error bit. It should be noted that, typically, an organization code is fetched from the DRAM unit 259 (=2,072/8) times in 8-bit units or a unit at one time.

Figure 10:
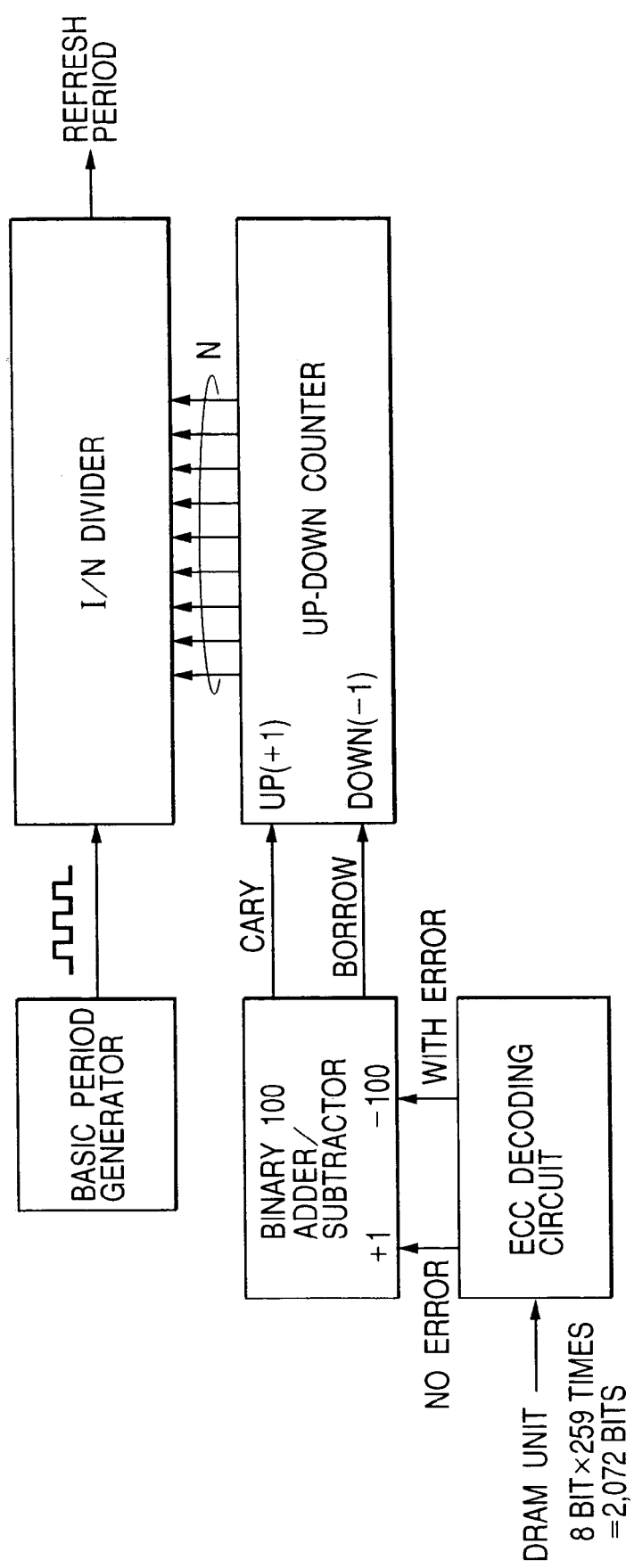
FIG. 10 shows a circuit of an embodiment implementing an error rate comparator used in the present invention.
Figure 11:
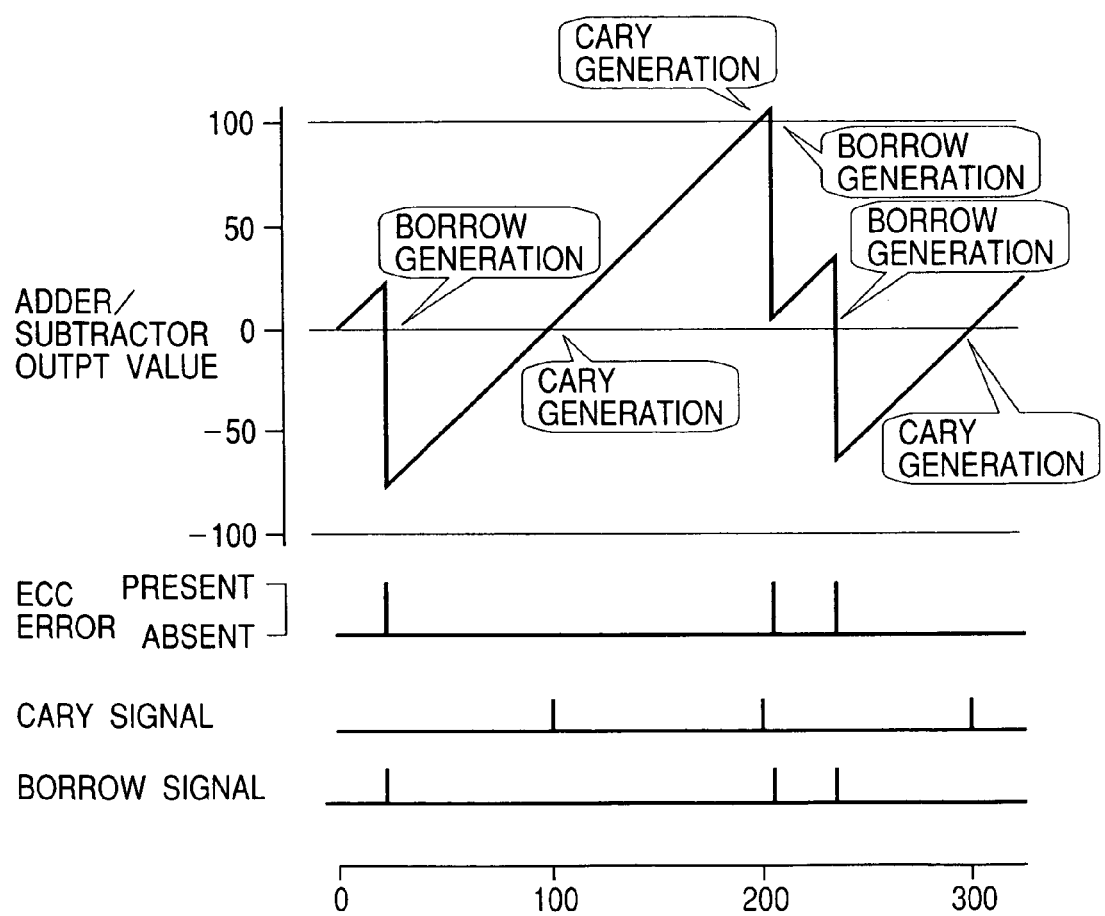
FIG. 11 is used for explaining the operation of the error rate comparator shown in FIG. 10.

FIG. 10 is a circuit diagram of an embodiment implementing the error rate comparator. On the other hand, FIG. 11 is used for explaining the operation of the error rate comparator. The error rate comparator shown in FIG. 10 is basically a binary 1-adder & 100-subtracter. If a result of parity checking carried out on an organization code indicates that there is no error, the binary 1-adder & 100-subtracter adds 1 to a present sum. If a result of parity checking carried out on an organization code indicates that there is an error, on the other hand, the binary 1-adder & 100-subtracter subtracts 100 from the present sum. Thus, for example, if 100 organization codes include 1 erroneous bit, the binary 1-adder & 100-subtracter outputs as many carry signals as borrow signals. If 100 organization codes include greater-than-1 erroneous bits, the binary 1-adder & 100-subtracter outputs fewer carry signals than borrow signals. If 100 organization codes include smaller-than-1 erroneous bits, on the other hand, the binary 1-adder & 100-subtracter outputs more carry signals than borrow signals.

In the explanatory diagram of FIG. 11 for describing the operation of the error rate comparator, the output of the binary 1-adder & 100-subtracter is set at 0 at a certain point of time. Thereafter, the output of the binary 1-adder & 100-subtracter is incremented by 1 each time no ECC error is detected. When an ECC error is detected, the binary 1-adder & 100-subtracter subtracts 100 from the output to result in a negative output, which generates a borrow. The borrow in turn causes a count value N of an up-down counter shown in FIG. 10 to be decremented to N−1. Since the count value is used as a divisor in the 1/N frequency divider, the refresh frequency is computed by dividing the basic frequency by (N−1).

Since the refresh period becomes shorter due to a higher refresh frequency, no ECC error is detected so that the output of the binary 1-adder & 100-subtracter is incremented by 1 for each absence of an ECC error. As the output of the binary 1-adder & 100-subtracter exceeds 0, a carry signal is generated. The carry signal in turn causes a count value of the up-down counter shown in FIG. 10 to be incremented from (N−1) back to N. As a result, the refresh period becomes longer due to a lower refresh frequency computed by dividing the basic frequency by N. If no ECC error is detected 100 consecutive times thereafter, the binary 1-adder & 100-subtracter again generates a carry signal. The carry signal in turn causes a count value of the up-down counter shown in FIG. 10 to be incremented from N to (N+1). As a result, the refresh period becomes longer due to a lower refresh frequency computed by dividing the basic frequency by (N+1).

Then, if an error is detected from a memory cell with a poor data sustaining characteristic, the binary 1-adder & 100-subtracter subtracts 100 from the output, generating a borrow. The borrow in turn causes the count value of an up-down counter shown in FIG. 10 to be decremented from (N+1) back to N. The refresh frequency is computed by dividing the basic frequency by N to give a shorter refresh period. If an ECC error is again detected, the binary 1-adder & 100-subtracter subtracts 100 from the output to result in a negative output, which generates a borrow. The borrow in turn causes the count value N of an up-down counter shown in FIG. 10 to be decremented to N−1. The refresh frequency is again computed by dividing the basic frequency by (N−1) to give an even shorter refresh period.

In the case of this embodiment, from 1 word line, data corresponding to 8 organization codes is read out, and parity checking is carried out on each of the codes to determine whether an error exists or does not exist. Even if any one of the 8 organization codes is determined to include an error causing the count value N of the up-down counter to be decremented to (N−1), the refresh period does not change immediately. By the same token, if the binary 1-adder & 100-subtracter generates a carry signal for the word line, causing the count value N of the up-down counter to be incremented to (N+1), the refresh period does not change immediately either. That is, the count value of the up-down counter is actually updated in accordance with a result of parity checking after the parity checking is completed for all the 8 organization codes of the word line. Then, the 1/N frequency divider sets a generation timing in a refresh request signal selecting a next word line. That is, the new refresh period is applied to the selected word line.

As described above, the carry and borrow signals generated by the binary 1-adder & 100-subtracter are supplied to the up-down counter for adding 1 to or subtracting 1 from its count value. That is, a carry signal drives the up-down counter to add 1 to the count value thereof. On the other hand, a borrow signal drives the up-down counter to subtract 1 from the count value thereof. Thus, if a carry and a borrow are both generated during a period in which a word line is selected, the frequency division ratio remains unchanged as it is. In this way, past error-absence events and past error-presence events are cumulatively summed up. The output N of the up-down counter is supplied to the 1/N frequency divider to be used for setting the division ratio of the basic period.

A refresh request signal is generated at a refresh period prior to the sleep mode, that is, a period obtained by division of the frequency of a pulse signal generated by the basic period generator shown in FIG. 10 by N. The refresh period can be regarded to represent a period in which no data is destroyed even in a memory cell having a shortest data sustaining period among memory cells of about 64 mega-bits. Thus, in the case of a DRAM unit and an ECC unit both mounted on the same semiconductor integrated circuit apparatus wherein a temperature-dependent timer, a frequency divider and a refresh address generating circuit are components common to refresh operations carried out in a normal operation and refresh operations carried out in a sleep mode, the frequency divider can be set in 2 ways, namely, a way for the normal operation and a way for the sleep mode. In particular, before a sleep mode is set, a period securing time required for carrying out parity checking on 8 organization codes on 1 word line as described above is set as a shortest period serving as a lower limit.

Thus, a pulse generated by the basic period generator set at the lower-limit period is supplied to the refresh address generating circuit as a refresh signal to start a refresh operation at the shortest period. As shown in FIG. 17, in most of data sustaining periods of memory cells, the memory cells each have a sufficient power to hold data for such a refresh period. Thus, when the sleep mode is established, a no-error state prevails continuously in the ECC unit. As a result, since the binary 1-adder & 100-subtracter generates a carry signal each time the number of no-error events exceed 100, the count value N of the up-down counter increases, lengthening the refresh periods of memory cells. That is, the carry signals are reflected and cumulated in the count value N of the up-down counter. Finally, the count value N representing a result of cumulative operations is used for determining the refresh period.

With the refresh period set at a value proper for the data sustaining characteristics of memory cells as described above, the number of carry signals generated in a certain period becomes equal to the number of borrow signals generated during the same period so that the count value N of the up-down counter and, hence, the refresh period are each stabilized at an all but fixed value. In this state, assume for example that the temperature changes abruptly and the average data sustaining time representing the data sustaining characteristics of the memory cells as a whole becomes shorter. In this case, the borrow signal is generated consecutively in a row and the count value N of the up-down counter is decremented by 1 each time a borrow signal is output. As a result, the refresh period also becomes shorter abruptly in accordance with the number of generated borrow signals. The decrementing of the count value N of the up-down counter by 1 for each generated borrow signal can also be regarded as an operation to sum up borrow signals.

In accordance with the present invention, outcomes of determination as to whether an error is present or absent are cumulated. Thus, an error rate can be determined in the so-called real-time manner from the result of cumulating outcomes of determination as to whether an error is present or absent. A result of the determination is used for controlling the refresh period so that the refresh period can be set at an optimum value correctly adjusted to the data sustaining power or the data sustaining characteristic of memory cells. That is, by taking advantage of the error correction power of the ECC unit at its maximum, the refresh period can be extended to about 10 seconds which are a long period absolutely unattainable in the refresh operation of the conventional DRAM.

Such a binary adder-subtracter needs only to have a function of holding a result of processing at least in the range −100 to +100. This is because carry and borrow signals generated by the binary 1-adder & 100-subtracter are cumulated and held in the up-down counter. The embodiment shown in FIG. 11 is an example capable of holding output values up to at least 200. To put it in detail, when an output value reaches 100, a carry signal is generated. Thereafter, detection of no error increments the output value by 1 while detection of an error subtracts 100 from the output value, resulting yet a difference greater than 0. Thus, it is also possible to provide a function for summing up carry or borrow signals in the adder-subtracter as is the case with the embodiment shown in FIG. 1.

The binary 1-adder & 100-subtracter employed in the embodiment shown in FIG. 10 can be further upgraded to a binary 1-adder/200-subtracter for subtracting 200 from its output instead of subtracting 100 in the event of an error. Since the operation of this binary 1-adder/200-subtracter corresponds to an erroneous bit per 200 organization codes, the error rate is monitored, being compared with a reference value of 0.00025%. In this case, however, the responsiveness to changes in environment such variations in temperature deteriorates by a quantity proportional to the improvement of the reference error rate.

In the embodiment shown in FIG. 10, if the decrement of 1 adopted in the up-down counter can be replaced by a decrement of 2, the error rate is also monitored, being compared with a reference value of 0.00025%. In addition, by using a binary 1-adder/200-subtracter, it is possible to improve responsiveness to, among other things, an abrupt increase in error rate due to a raise in temperature.

Figure 12:
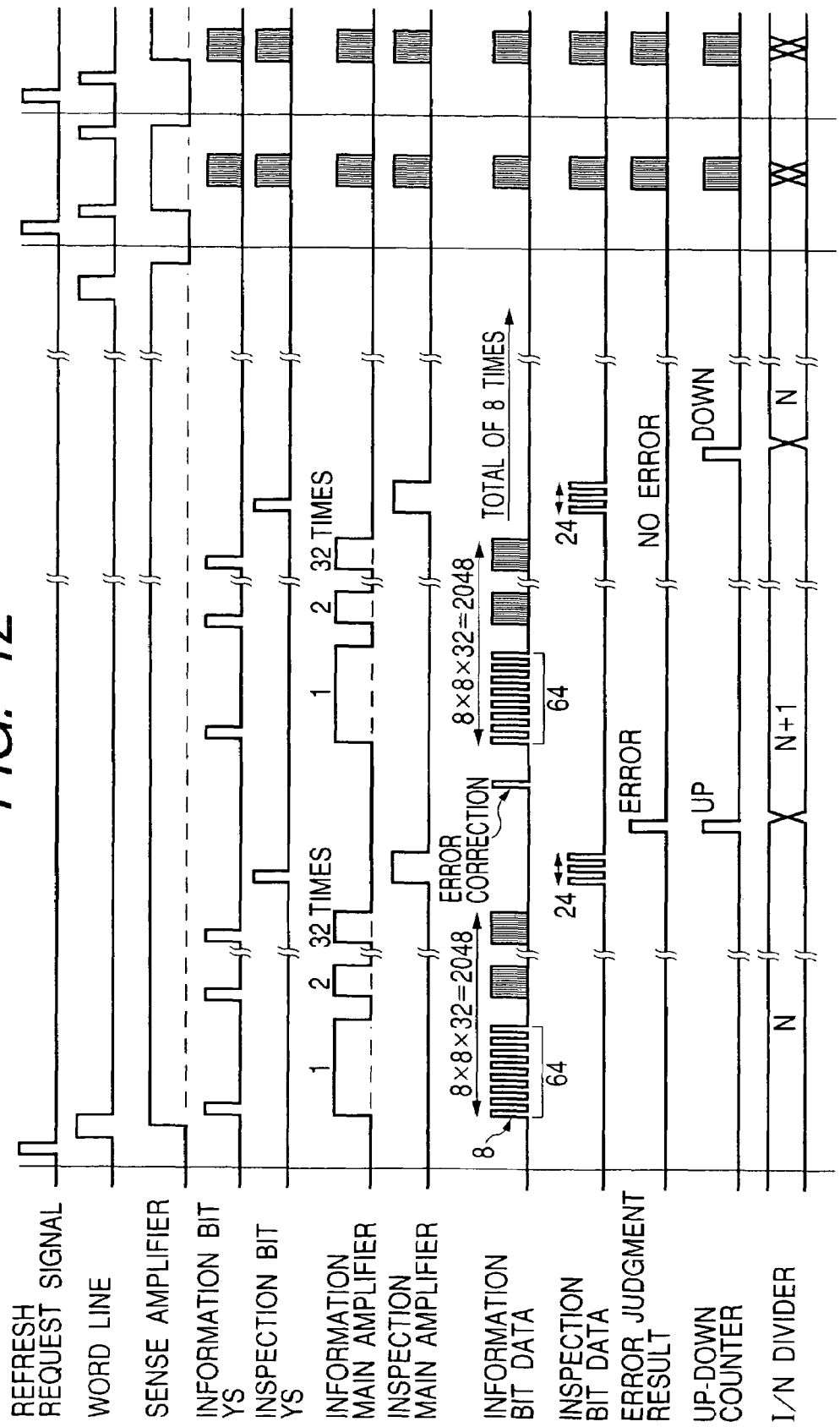
FIG. 12 shows timings used for explaining a typical operation in an information sustaining mode of a DRAM provided by the invention.

FIG. 12 shows timings used for explaining typical operations in the information sustaining mode (the sleep mode) of a DRAM provided by the present invention. Triggered by a refresh request signal, a row-address select circuit operates to select a word line. As a result of this operation to select a word line, about 16K memory cells are selected from the DRAM unit, and information stored in the selected memory cells is amplified by sense amplifiers before being stored back into the memory cells. In this embodiment, the word line is set at a deselected level for some purposes when the operation of the sense amplifiers to sustain the information is started as described above. The purposes include reduction of power consumption and prevention of device deterioration due to application of a high voltage to the gate of the address select MOS employed in each memory cell.

An ECC address generating circuit generates a Y address (or information bits YS) to select memory cells for 64 bits. Information Stored in the selected memory cells is output to information main amplifiers. If the ECC unit and the DRAM unit are created in the same semiconductor integrated circuit device as described previously, 64-bit data is divided into eight 8-bit units to be transferred sequentially to the ECC unit one unit after another. Such an operation is carried out repeatedly 32 times to read out 2,048-bit data composing 1 organization code. Then, inspection bits are transferred as 3 consecutive 8-bit units to allow parity checking to be carried out by using the 24 inspection bits. A result of the parity checking is used for determining whether an error is present or absent.

If a result of determination indicates that an error has been detected as shown in the figure, the up-down counter carries out an operation to increment its count value. As a result, the division ratio N of the frequency divider is also incremented to (N+1). Then, 64-bit data including error correction bits is written into 64 sense amplifiers indicated by the corresponding information bits YS. That is, since the word line is deselected as described above, the error correction data is written into the sense amplifiers.

Also in the following description, a word line is connected to memory cells for storing approximately 16 kilobits, and 1 organization code comprises about 2 kilobits. Thus, the whole data stored in the memory cells is transferred as 8 consecutive organization codes. If successive no-error states are detected, the adder-subtracter generates a carry signal which in turn generates a down signal supplied to the up-down counter to decrement its count value by 1. As a result, the division ratio N of the frequency divider decreases.

Before selecting a word line, for example, assume that the adder-subtracter has a computed value of typically 95. Also assume that an error is detected in an organization code read out initially in an operation to select a word line. In this case, the adder-subtracter subtracts 100 from 95 (95−100) to give a new computed value of −5. As a result, a borrow signal is generated, causing the up-down counter to count up. Assume that no error is detected from 5 consecutive organization codes of the remaining 7 organization codes following the organization code read out initially on the word line. In this case, the computed value of the adder-subtracter becomes 0, causing a carry signal to be generated. The carry signal in turn causes the up-down counter to count down. As a result, the division ratio N of the frequency divider is restored to its original value, making the period of the refresh request signal unchanged. That is, it is possible to maintain a state in which only 1 error exists in 100 organization codes or to sustain an error rate of 0.0005% described above.

When parity checking carried out by the ECC unit on 8 organization codes on 1 word line is completed, the DRAM unit does not carry out any operations till the operation is switched to processing to select a next word line. That is, only sense amplifiers are in an operating state, holding information stored in memory cells of the word line. Then, prior to the switching to a next world line, the word line connected to the memory cells, information stored in which is held by the sense amplifiers, is again put in a selected state so that stored information of about 16 kilobits held by the sense amplifiers is again written into the memory cells. In this way, by delaying a timing to rewrite information into memory cells by as much a delay time as possible, the effective data sustaining time of the memory cells can be prolonged.

After the rewrite operation is completed, an operation to select a next word line in accordance with a refresh request signal is started. A timing to again select such a word line can be set immediately before the next refresh request signal is generated. Thus, the timing can be generated by using a count signal produced by the frequency divider. That is, it is possible to generate a timing to again select a word line correctly ahead of a timing to generate a refresh request signal by some basic pulses.

The frequency divider comprises a counter and a comparator. It should be noted, however, that this configuration of the frequency divider is typical. The counter is typically an up counter for generating pulses of the basic period generator. The comparator compares the count value of the counter with the N value of the up-down counter. When both the values agree with each other, a refresh period signal, that is, a refresh request signal, is generated to reset the counter. In this configuration, when the value of N is changed, the period at which the next refresh signal is to be generated is changed as well. At that time, by setting the value of M where (N>M), the comparator is capable of easily generating a timing to again select the word line ahead of a timing to generate a refresh request signal by (N−M) pulses.

On the other hand, a down counter is employed with the count value N of the up-down counter set in the down counter as an initial value. In such a scheme, the down counter starts counting down pulses generated by the basic period generator after a refresh request signal has been generated. As the count value of the down counter reaches 0, a next refresh request signal is generated. Control is executed to determine a timing to generate a next refresh request signal by setting an updated count value N of the up-down counter in the down counter as an initial value.

Figure 13:
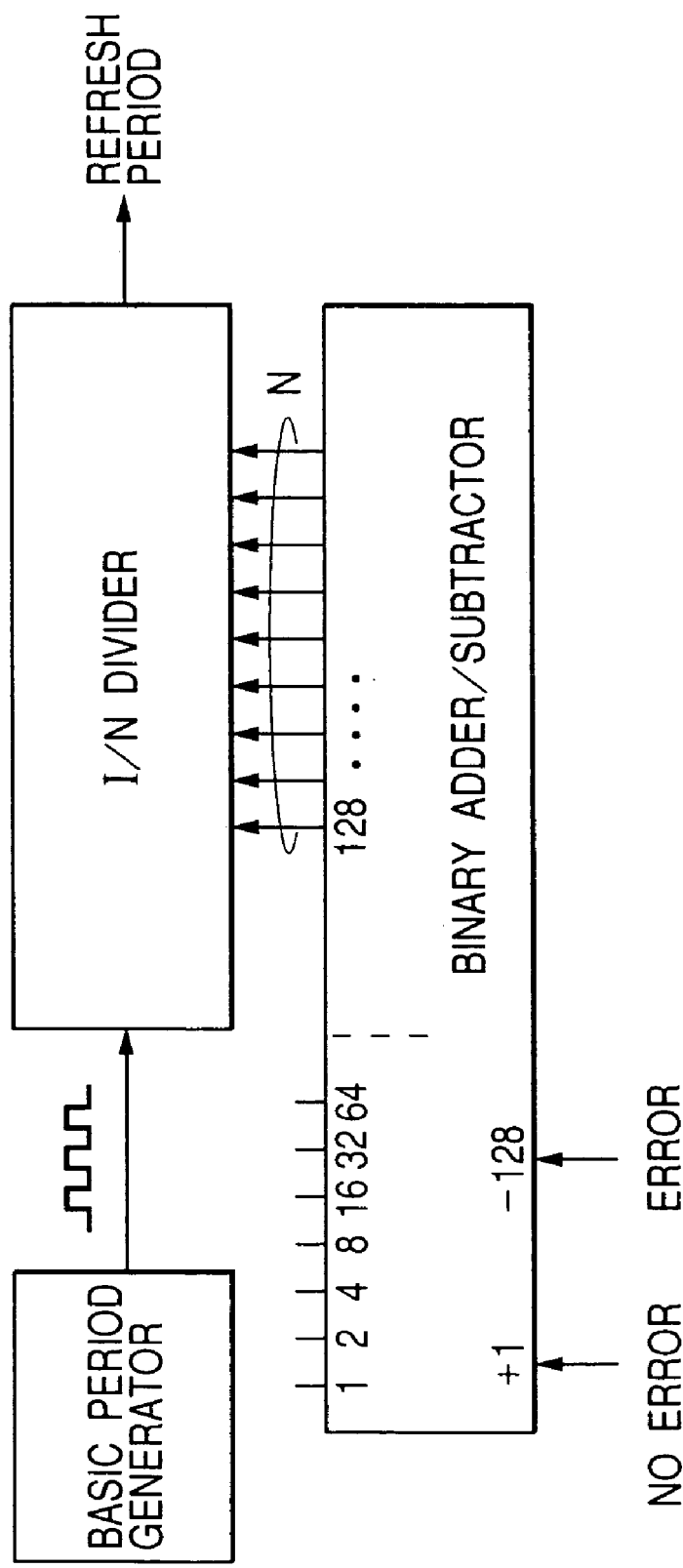
FIG. 13 shows a circuit of another embodiment implementing an error rate comparator used in the present invention.

FIG. 13 shows a circuit of another embodiment implementing the error rate comparator. In this embodiment, the binary 1-adder & 100-subtracter and the up-down counter are combined to form a binary 1-adder & 128-subtracter. In order to make the actual circuit simpler, the binary 1-adder & 128-subtracter subtracts 128 instead of 100 from the count value thereof in the event of an error. In order to implement such a scheme, the binary 1-adder & 128-subtracter is designed as a binary up-down counter wherein counting units at first to sixth stages in the range 1 to 64, correspond to the adder-subtracter described above. A no-error signal received by an input terminal of the binary 1-adder & 128-subtracter triggers an up operation to increment the output of the binary 1-adder & 128-subtracter by 1. On the other hand, an error signal received by another input terminal of the binary 1-adder & 128-subtracter triggers a down operation to decrement the output of the binary 1-adder & 128-subtracter by 128. That is, a $1^{st}$-bit output to a 64th-bit output are made invalid, and a $128^{th}$-bit and subsequent bit outputs are supplied to the 1/N frequency divider as a value of N. To be more specific, the $128^{th}$-bit output is the least significant bit of a plurality of bits specifying the value of N. In this case, being different from a case in which an error is included in one of 128 organization codes, error rates are monitored against a reference value of 0.0004%.

Figure 14:
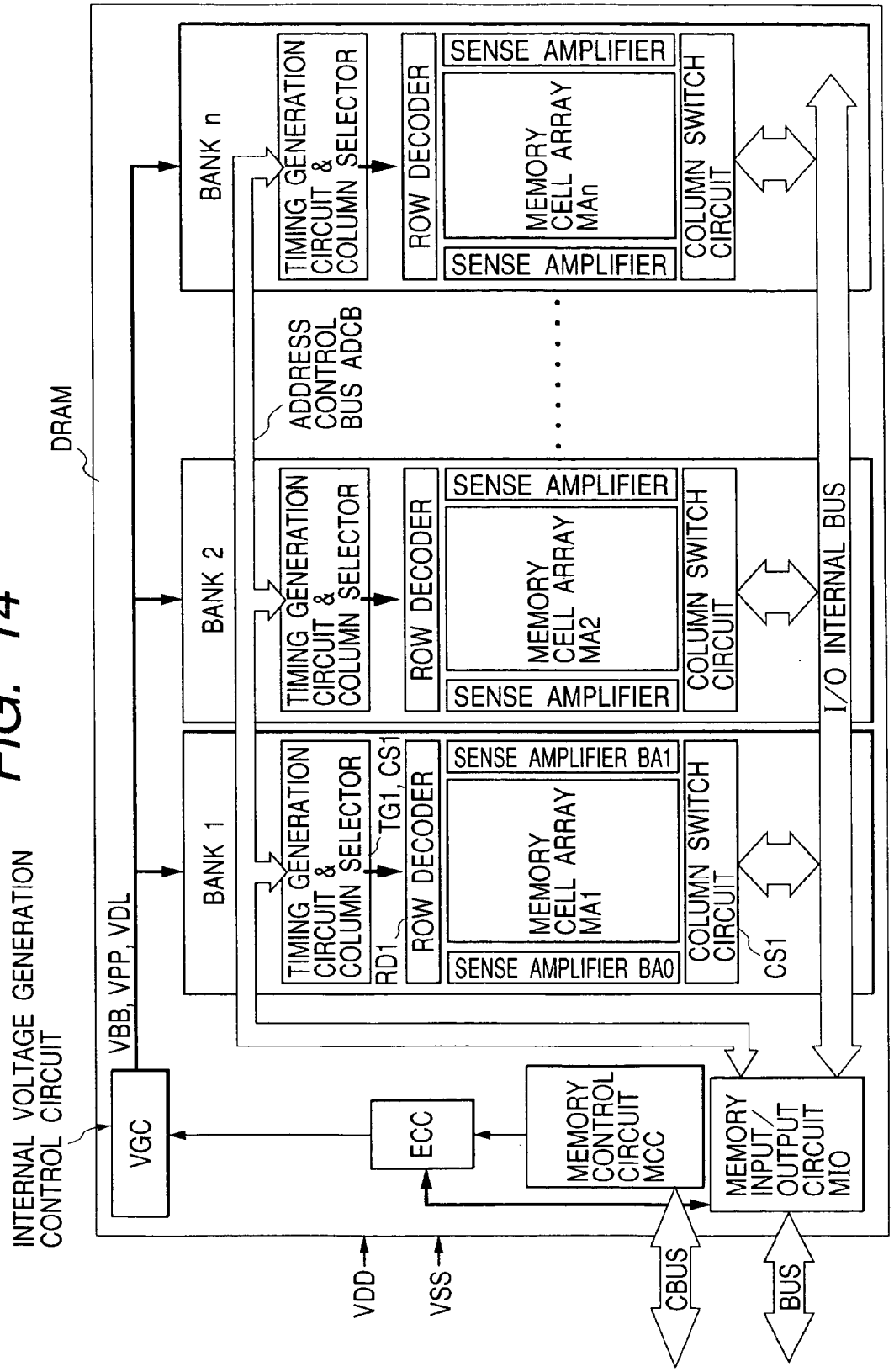
FIG. 14 shows a block diagram of an embodiment implementing a DRAM applied to the embodiment shown in FIG. 1 or 2.

FIG. 14 shows a block diagram of a typical DRAM applied to the embodiment shown in FIG. 1 or 2. This DRAM is a module or a functional unit in the system LSI. This DRAM has a typical bank configuration suitable for a memory with a large storage capacity. The number of memory banks can be changed to any value not exceeding a typical value of 16. Notations bank 1, bank 2, . . . and bank n shown in the figure denote the first bank, the second bank, . . . and the nth bank respectively. Much like the other memory banks, the first memory bank (bank 1) comprises a bit line precharge circuit, a timing generation circuit TG1, a column selector CS1, a row detector RD1, a column switch circuit CS1, sense amplifiers SA0 and SA1 and a memory cell array MA1. The bit line precharge circuit not shown in the figure is integrated with the sense amplifiers SA0 and SA1.

Provided for the memory banks, an address-control bus ADCB comprises address and control signals. Also provided for the memory banks, a memory internal bus (I/O bus) IOB serves as a bus for inputting and outputting data. There is also provided a memory input/output circuit MIO common to the address/control bus ADCB and the memory internal bus IOB. The memory input/output circuit MIO has an internal port linked to the internal bus BUS shown in FIG. 1. The DRAM is supplied with operating voltages such as a raised voltage VPP, an internal voltage VDL and a substrate voltage VBB generated by an internal voltage generation control circuit VGC through a set of wires.

In the above description, for the sake of convenience in handling management units of design data in design automation for designing the semiconductor integrated circuit device, a set of elements in a broader range can be regarded as a set comprising fewer elements. For example, the memory cell array MA1, the sense amplifiers SA0 and SA1, the row decoder RD1 and the column switch circuit CS1, which are employed in the first memory bank, are regarded as components composing a memory mat. On the other hand, the timing generation circuit TG1 as well as the column selector CS1, which are also employed in the first memory bank, are regarded as components composing a bank control circuit. In this way, each of the memory banks can be regarded as a unit consisting of only a memory mat and a bank control circuit.

An outline of the DRAM shown in the figure is explained as follows. A memory cell array like the one denoted by MA1 in the figure comprises a plurality of dynamic memory cells laid out to form a matrix, a plurality of word lines connected to terminals for selecting some of the memory cells and a plurality of bit lines connected to data I/O terminals of the memory cells.

A select MOSFET employed in each memory cell has a configuration comprising an N-type source area and an N-type drain area, which are created on a P-type well area formed on a semiconductor substrate made of typically P-type monocrystalline silicon. A negative electric potential substrate bias voltage VBB generated by the internal voltage generation control circuit VGC in the DRAM is supplied to the P-type well area in which the memory cell is created. Thus, the magnitudes of a tailing current and a leak current of the select MOSFET employed in the memory cell are reduced, resulting in a decreased information leak from an information storing capacitor employed in the memory cell.

On the P-type well area, the information storing capacitor of the memory cell is created with an insulation film sandwiched between the capacitor and the well area. The insulation film is typically a silicon-oxide film. One of the electrodes of the information storing capacitor is electrically connected to an electrode area serving as the source area of the select MOSFET. The other electrode is connected to the other electrodes of a plurality of other information storing capacitors to form the so-called plate electrode serving as an electrode common to the capacitors. As a capacitance electrode, the plate electrode is provided with a predetermined electric potential.

It is desirable to make the size of the information storing capacitor relatively small in order to make the size of the memory cell array small. At the same time, it is also desirable to provide the information storing capacitor with a large capacitance value for sustaining information for a long time by itself. In order to provide the information storing capacitor with a large capacitance value, a material having a relatively large dielectric constant is selected as a substance for making a dielectric film sandwiched between the electrodes of the capacitor. Examples of the material having a relatively large dielectric constant are tungsten oxide and silicon oxide. In addition, the thickness of the dielectric film is made extremely small in order to increase capacitance per unit area. An electric potential applied to the plate electrode of a plurality of information storing capacitors is generated by the internal voltage generation control circuit VGC at an intermediate level about equal to half the power supply voltage VDL supplied to the internal voltage generation control circuit VGC.

A voltage applied to an electrode of the information storing capacitor other than the plate electrode is a high-level voltage such as the power supply voltage VDL or a low level voltage such as a voltage of the ground electric potential in dependence on information to be stored in the information storing capacitor. In either case, the electric potential applied to the plate electrode is about equal to half the power supply voltage VDL. Thus, a voltage applied to the dielectric film is limited to a small value equal to about half the power supply voltage VDL. Therefore, the withstand voltage that the dielectric film is required to have can be reduced. In addition, the magnitude of an undesirable leak current can also be decreased due to the lower voltage applied to the dielectric film. As a result, the thickness of the dielectric film can be reduced to a minimum.

The operations of a timing generation circuit such as the timing generation circuit TG1 and a column selector such as the column selector CS1 are controlled by an operation control signal generated by a global control circuit employed in a memory control circuit MCC. The column selector CS1 and the timing generation circuit TG1 are selected and then activated by a bus select signal supplied through the address-control bus ADCB. The selected column selector CS1 and the selected timing generation circuit TG1 generate a variety of internal timing signals for controlling the operations of a variety of circuits such as a bit line precharge circuit for bit lines of the memory cell array, the sense amplifiers, the row decoder RD1 and internal column selectors inside the selected column selector CS1 itself. The operations of the internal column selectors inside the selected column selector CS1 and the timing generation circuit TG1 are controlled by some of the internal timing signals to decode a column address signal supplied through the address-control bus ADCB. As a result of decoding the column address signal, a decode signal is generated for driving the column switch circuit CS1.

The operation timing of a row decoder such as the row decoder RD1 is controlled by an internal timing signal supplied by the selected time selector CS1 and the timing generation circuit TG1 to decode an address signal supplied through the address-control bus ADCB. As a result of decoding the column address signal, a decode signal is generated for selecting a word line of the memory cell array MA1.

The bit line precharge circuit not shown in the figure is driven to operate by a precharge timing signal with a timing typically prior to activation of a row decoder such as the row decoder RD1 to provide electric charge in advance to associated bit lines of the memory cell array MA1 to an electric potential about half the power supply voltage VDL.

Sense amplifiers such as the sense amplifiers SA0 and SA1 are driven to operate by a sense amplifier internal timing signal generated by the timing generation circuit TG1 and the column selector CS1 after the row decoder RD1 has been activated. The sense amplifiers SA0 and SA1 amplify signals appearing on bit lines of memory cells selected by the row decoder RD1, that is, read signals. Every sense amplifier comprises a plurality of unit sense amplifiers each associated with a bit line provided with virtually the same configuration as a CMOS sense amplifier. It should be noted that the unit sense amplifiers themselves are not shown in the figure.

To put it in detail, a unit sense amplifier comprises a pair of P-channel MOSFETs and a pair of N-channel MOSFETs. The P-channel MOSFETs are cross-connected. To be more specific, the gate of the first MOSFET is connected to the drain of the second MOSFET and the drain of the first MOSFET is connected to the gate of the second MOSFET. By the same token, the N-channel MOSFETs are cross-connected. The drains of the P-channel MOSFETs and the drains of the N-channel MOSFETs are connected to an associated bit line. The sources of the P-channel MOSFETs are connected to each other, and receive the power supply voltage VDL supplied by way of a switch MOSFET, the operation of which is controlled by a sense-amplifier internal timing signal. In the same way, the sources of the N-channel MOSFETs are connected to each other, and receive an operating electric potential such as the ground electric potential supplied by way of a switch MOSFET, the operation of which is controlled by a sense-amplifier internal timing signal.

A pair of sense amplifiers such as the sense amplifiers SA0 and SA1 are provided in a layout sandwiching the memory cell array MA1 to achieve the following objective. The sense amplifier SA0 on one side of the memory cell array MA1 are connected to a plurality of bit lines not adjacent to each other in the memory cell array MA1. The sense amplifier SA1 on the other side of the memory cell array MA1 are connected to a plurality of remaining bit lines also not adjacent to each other in the memory cell array MA1. In dependence on the size, MOSFETs composing the sense amplifier need to be laid out at a relatively large pitch. Such a configuration is effective for reduction of the pitch of bit lines in the memory cell array since the configuration allows a relatively large pitch of MOSFETs composing a sense amplifier.

A column switch circuit such as the column switch circuit CS1 is driven to operate by a select signal generated by a column selector CS1 associated with the column switch circuit CS1. The column switch circuit selects a bit line specified by the column selector CS1 among a plurality of bit lines in the memory cell array MA1, and connects the selected bit line to the memory internal bus IOB.

The memory input/output circuit MIO is connected to the internal bus BUS supplying address and control signals to the memory input/output circuit MIO. The memory input/ output circuit MIO passes on the address and control signals to the address-control bus ADCB. The memory input/output circuit MIO also inputs and outputs memory data from and to the internal bus BUS and the memory internal bus IOB.

The memory control circuit MCC receives operation control signals generated by typically a CPU of the semiconductor integrated circuit device, and executes control operations according to these operation control signals. The memory control circuit MCC controls refresh operations and read/write operations of the ordinary operation mode and sets a sleep mode (or an information sustaining mode) or the like. In addition, the memory control circuit MCC includes a refresh control circuit. In this case, a refresh operation is carried out typically for all banks at the same time. It should be noted, however, that this simultaneous refresh operation is not required in particular.

The internal voltage generation control circuit VGC receives a power supply voltage applied between a power supply pin VDD and a reference potential pin VCC, which are provided on the DRAM, generating a substrate bias voltage VDL and a substrate bias voltage VBB for the memory cell array like the one described earlier. In addition, the internal voltage generation control circuit VGC also generates a raised voltage VPP used at a level of selecting a word line besides internal voltages including the plate voltage. The substrate bias voltage VBB for the memory cell array is typically generated by a circuit comprising an oscillator, a charge pump circuit and a rectifier circuit, which are not shown in the figure in detail. It should be noted that such a configuration is not required in particular. The oscillator is typically a ring oscillator driven by the power supply voltage VDD. The ring oscillator comprises a CMOS control gate and CMOS inverter circuits provided at a plurality of stages. The charge pump circuit receives an oscillation signal having an amplitude set at the level of the power supply voltage VDD from the oscillator through a MOSFET connected to a capacitor and a diode. The charge pump circuit periodically generates pulses at a negative electric potential level. The rectifier circuit is a MOSFET connected to a diode. The rectifier circuit supplies the pulses generated by the charge pump circuit at a negative electric potential level to an output point. As a result, the pulses appear at the output point as an output VBB for a capacitor such as a parasitic capacitor. The raised voltage VPP is generated by a charge pump circuit similar to the one described above at a level equal to (VDL+Vth) where Vth is the threshold voltage of an address select MOSFET and VDL is a voltage obtained by lowering the power supply voltage VDD.

The DRAM implemented by this embodiment typically takes in an address signal through an external bus as a combination with a command. It should be noted, however, that this scheme is not particularly required. If the memory input/output circuit MIO determines that a signal obtained from the external bus is an address signal, the signal is passed on to the address-control bus ADCB. If the memory input/output circuit MIO determines that a signal obtained from the external bus is write data, on the other hand, the signal is passed on to the I/O internal bus. As described above, data is received and supplied from and to the external bus in 64-bit units. In this case, by sharing a transmission line of an address signal as the external bus, it is possible to prevent the number of signal lines in the external bus from increasing.

In the DRAM implemented by this embodiment, the refresh period in the sleep mode is lengthened by using an ECC unit like the one described earlier. In the case of memory cells having a very good data sustaining characteristic as a whole, the refresh period can be prolonged to a value greater than 10 seconds as described above. With such an extremely long refresh period, however, the error rate determination can no longer be determined. In order to solve this problem, attention is paid to the fact that an actual data sustaining power representing the data sustaining characteristic of the memory cells is reflected in the dividing ratio N of the frequency divider, and the voltage VDL for writing data into the memory cells as well as the substrate voltage VBB are controlled in accordance with the frequency division ratio N to reduce the magnitude of a consumed current. As described before, the frequency division ratio N can be regarded as a quantity representing a cumulative sum of increments representing absent-error detection results and decrements representing absent-error detection results.

Assume for example that the dividing ratio N of the frequency divider is greater than a predetermined value P. In this case, the data sustaining characteristic of the memory cells is determined to be good and the voltage VDL or the substrate voltage VBB is lowered. Several values are determined in advance for each of the voltage VDL and the substrate voltage VBB so that control can be executed in a plurality of ways. To be more specific, criterion values P1 to Pn and VDL values VDL1 to VDLn or VBB values VBB1 to VBBn for the criterion values P1 to Pn respectively are set in advance. As a result, the data sustaining power or characteristic of the memory cells can be assured and, at the same time, the magnitude of the consumed current can be reduced.

In the information sustaining mode, while a refresh operation is being carried out at intervals of about 2.4 ms as described above, data of a refreshed word line is read out and error checking is carried out by the ECC unit once 12 word lines corresponding to a period of 30 ms. In a refresh operation carried out on 1 word line, data is transferred to the ECC unit in 8-bit units. Since 1 organization code consists of 8×32+3 (=259) units including inspection bits, for 8 organization codes per word, data is transferred 259×8 (=2072) times per word line. Normally, an ECC operation is carried out for each organization code. Thus, error checking is carried out 8 times per world line. These operations including an operation to select a word line and amplification by sense amplifiers can be completed in a period of time shorter than 0.4 ms.

As a result, for a refresh operation carried out at intervals of about 2.4 ms by being switched from a word line to another, during most of the period of 2 ms, only a counting operation is carried out by the frequency divider to generate a next refresh request signal. Thus, for control of the internal voltage generation control circuit VGC executed by the ECC unit, functions may be added to cut off paths of a DC current and a leak current in the DRAM. For example, on the DRAM side, sense amplifiers need to hold stored information for 1 world line and an address for selecting the word line needs to be held as well. Thus, during the 2-ms period between the completion of the ECC operation for 1 word line and selection of the next world line to which data is to be rewritten, the circuits for generating the raised voltage VPP and the substrate voltage VBB also reduce the number of charge pump operations and/or carry out other operations to set a reduced power consumption mode.

Figure 15:
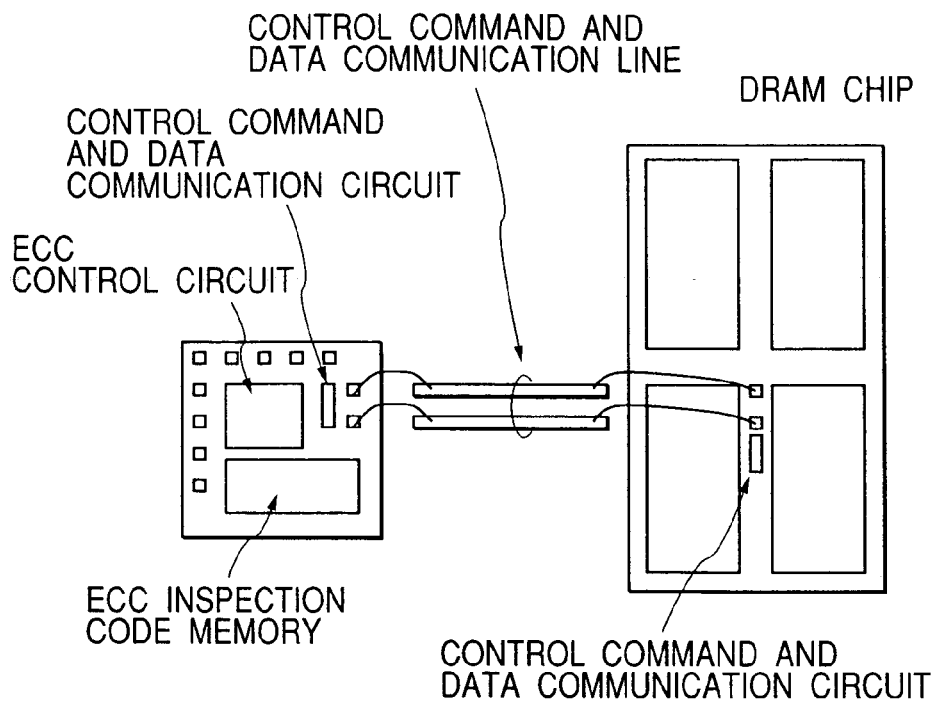
FIG. 15 shows the configuration of an embodiment implementing a semiconductor integrated circuit device provided by the present invention.

FIG. 15 shows the configuration of an embodiment implementing a semiconductor integrated circuit device provided by the present invention. In this embodiment, the ECC control unit and the ECC memory, which are included in the embodiment shown in FIG. 9, are built in an ECC chip separated from the DRAM chip. Control commands and data are exchanged between the DRAM chip and the ECC chip by at least 2 sense amplifiers for communicating the control commands and the data. Thus, the DRAM chip needs only to include additional circuits comprising a circuit for communicating control commands and data and pads for the communication circuit in order to combine the DRAM chip with the ECC chip. In addition, the DRAM chip can also be used as a standalone unit.

Figure 16A:
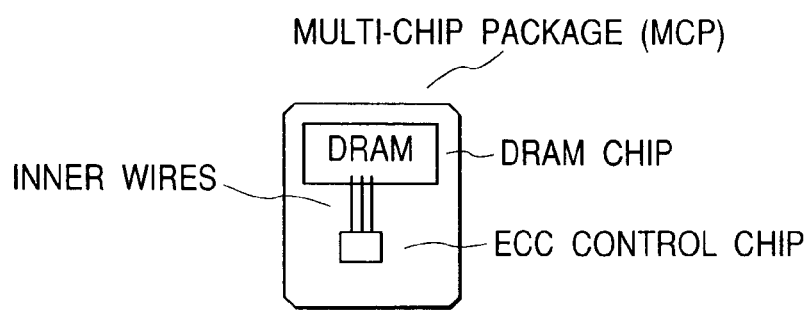
FIGS. 16(A) and 16(B) show the configuration of an embodiment implementing a semiconductor integrated circuit device provided by the present invention.
Figure 16B:
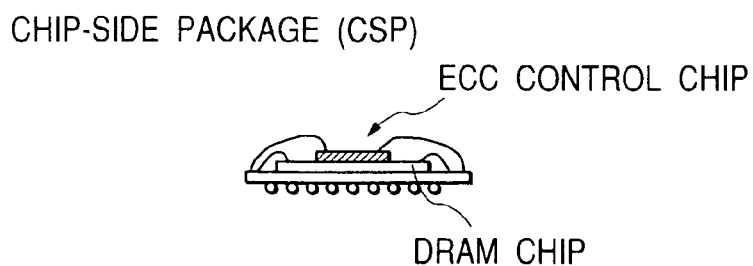

FIGS. 16(A) and 16(B) show the configuration of an embodiment implementing a semiconductor integrated circuit device provided by the present invention. That is, the figures show an implementation of a multichip packet (MCP) of the embodiment shown in FIG. 15. To be more specific, FIG. 16(A) shows the multichip packet wherein the DRAM and ECC chips are connected to each other by inner wires, that is, bonding wires and lead frames. On the other hand, FIG. 16(B) shows a chip-size package (CSP) which is assembled into a structure comprising the DRAM chip and the ECC chip stacked on the DRAM chip. In the chip-size package CSP, inner wires are created by adopting a bonding technique. In this way, 2 semiconductor chips are built in a single semiconductor integrated circuit device in a variety of implementations for a broad range of applications.

In this embodiment, it is necessary to adjust the refresh period of the DRAM to the information sustaining time of a worst bit. By combining the DRAM with an ECC unit, however, the refresh period can be lengthened to a value longer than a minimum time so as to reduce the magnitude of a refresh current. In such a configuration, destroyed data of a memory cell can be corrected by using an ECC memory and an ECC code compound circuit mounted on the package. By using an ECC control circuit and by securing a parity-bit area with a size much smaller than the total storage capacity of the DRAM, the refresh period of the DRAM can be lengthened considerably. In addition, by monitoring the correction rate produced by the ECC unit, it is possible to generate an internal refresh period following changes in ambient temperature.

Furthermore, by controlling the operating voltage VDL and the substrate voltage VBB of the DRAM by using monitoring results output by the ECC unit, the magnitude of a pn-junction leak current in each memory cell can be reduced. Moreover, by increasing the amount of information charge, the information sustaining time of a worst bit can be prolonged. As a result, the effects exhibited by the ECC unit allow the refresh period to be lengthened. On the contrary, by lowering the voltage applied to a bit line, the magnitude of a refresh operation current can be further decreased. That is, the purpose of the power supply control is to reduce the magnitude of the leak current by lowering the substrate voltage VBB and to reduce the magnitude of the consumed current by lowering the operating voltage VDL and the raised voltage VPP.

Since it is possible to implement addition of memory cells with a size smaller than the total storage capacity of the DRAM for an ECC purpose, the chip area can be prevented from increasing. Since an SRAM can be used instead of adding DRAM memory cells as the additional memory cells for an ECC purpose, the range of applications can be broadened. In addition, since it is possible to combine the main chip and the ECC chip which are originally chips separated from each other, the range of applications can be broadened. Furthermore, since the refresh period is automatically optimized by monitoring the ECC error rate, strict trimming of a refresh timer period by probe inspection is not required. As a result, the cost can be reduced.

Effects exhibited by the embodiments described above are explained as follows:

(1) Detection of an error is carried out on a plurality of pieces of data by using the pieces of data and inspection bits provided for the pieces of data. If no error is detected, a first detection signal is accumulated in a first direction, that is, the first detection signal is added to a sum. If an error is detected, on the other hand, a second detection signal is accumulated in a second direction, that is, the second direction signal is multiplied by a weight to give a product before subtracting the product from the sum wherein the weight is large enough to result in a value of the product corresponding to a desired error rate. The sum obtained as a result of accumulation in the first and second directions is used to accurately determine an error rate for data processed so far.

(2) In addition to what is described above, by reading out the pieces of data and the inspection bits from a memory circuit, it is possible to exhibit an effect of an ability to determine the information sustaining power of the memory circuit.

(3) In order to exhibit an effect of an ability to implement information sustaining operations realizing small power consumption and yet assuring high reliability, there is provided an error rate select circuit activated in an information sustaining mode, wherein a plurality of pieces of data is read out from a memory circuit comprising dynamic memory cells whereas inspection bits for detection and correction of an error existing in the pieces of data are generated. The inspection bits are stored in an additional memory circuit. An ECC circuit reads out the pieces of data from the memory circuit and the inspection bits associated with the pieces of data from the additional memory circuit to detect and correct an error in the pieces of data at fixed refresh intervals. If no error is detected, a first detection signal is accumulated in a first direction, that is, the first detection signal is added to a sum. If an error is detected, on the other hand, a second detection signal is accumulated in a second direction, that is, the second direction signal is multiplied by a weight to give a product before subtracting the product from the sum wherein the weight is large enough to result in a value of the product greater than the first detection signal. If the sum increases in the first direction, exceeding a predetermined value, the refresh period is lengthened by a predetermined incremental time. If the sum decreases in the second direction, becoming smaller than another predetermined value, on the other hand, the refresh period is shortened by a predetermined decremental time.

(4) In addition to what is described above, the additional memory circuit is designed to comprise dynamic memory cells in the same configuration as the memory circuit and, by sharing an address select circuit of the X system, large-scale integration can be implemented.

(5) Besides what is described above, a refresh address generating circuit is shared by refresh operations carried out in the information sustaining mode and in a normal mode including operations to read out and write data from and into the memory circuit, and the ECC circuit is provided with an ECC address generating circuit for selecting the pieces of data from word lines specified by a refresh address. An X-system address signal generated by the refresh address generating circuit and a Y-system address signal generated by the ECC address generating circuit are supplied to an address control circuit. Thus, by supplying an X-system address signal and a Y-system address to the memory circuit in the information sustaining mode and in the normal mode, the additional circuit can be made simpler. As a result, it is possible to exhibit an effect of an ability to implement information sustaining operations realizing small power consumption and yet assuring high reliability in a rational manner.

(6) In addition to what is described above, the refresh address generating circuit generates an oscillation signal with the frequency thereof controlled by a temperature-dependent timer and a refresh address signal output by counting the number of activation signals produced by a variable divider circuit by division of the frequency of the oscillation signal. By letting the error rate select circuit set a dividing ratio of the variable divider circuit, there is exhibited an effect of an ability to set a refresh period at a value appropriate for an error rate.

(7) Besides what is described above, the ratio of the product of the second detection signal and the weight to the first detection signal is set at a value appropriate for an allowable error rate to provide an effect of an ability to assure desired reliability for the error rate.

(8) In addition to what is described above, the allowable error rate is determined to be 8 from a binary number consisting of a plurality of bits. The first detection signals are supplied to a first binary counter for the bits to be counted by the first binary counter and a carry generated by the first binary counter is supplied to a second binary counter which carries out a counting-up operation in response to the supplied carry. The second detection signal is supplied to the second binary counter which carries out a counting-down operation in response the supplied second detection signal. As a result, there is exhibited an effect of an ability to set a count value produced by the second binary counter as the dividing ratio of the variable divider circuit as it is by using merely a simple configuration.

(9) Besides what is described above, by forming the memory circuit and the data holding control circuit on a single semiconductor chip, it is possible to exhibit an effect of an ability to provide a semiconductor integrated circuit device including a DRAM with high performance and a good information sustaining characteristic.

(10) In addition to what is described above, the memory circuit is created on a first semiconductor chip, the data holding control circuit is created on a second semiconductor chip and the first as well as second semiconductor chips are mounted on a multichip package to provide a single semiconductor integrated circuit device. As a result, it is possible to exhibit an effect of an ability to provide a general-purpose characteristic to the first semiconductor chip and, hence, improve mass productivity.

(11) Besides what is described above, the first and second semiconductor chips are connected to each other by a control command and data communication line, and a communication circuit is provided in each of the first and second semiconductor chips. As a result, it is possible to provide an effect of an ability to suppress a current consumed in an ECC operation.

(12) In addition to what is described above, the first and second semiconductor chips are mounted on a single package in a stacked structure to make the temperature of the first semiconductor chip all but equal to that of the second semiconductor chip in order to give an effect of simple control.

(13) Besides what is described above, the data holding control circuit is provided with a function for controlling the substrate voltage or the level of a voltage for writing data into memory cells in accordance with a cumulative quantity computed in an operation to monitor the error rate. As a result, it is possible to exhibit an effect of reduction of power consumption.

In the above description, the present invention discovered by the inventor has been exemplified in concrete terms by using preferred embodiments. It should be noted, however, that the scope of the present invention is not limited by the preferred embodiments. That is, it is needless to say that a variety of changes and modifications in a range not departing from essentials of the present invention can be made to the embodiments. For example, the ECC circuit can be any circuit as long as the circuit has the power to correct an error. For instance, the ECC circuit can be a circuit using a CRC.

In addition, the method of determining an error rate in accordance with the present invention can be applied to data transmitted through a communication line. In this case, if the detected error rate is higher than a desired level, a request for retransmission of data is typically made.

Furthermore, in the case of a nonvolatile memory such as a flash memory or a ferroelectric substance memory, a result of error rate determination described above may be used for detecting deterioration of the information sustaining characteristic. The method can be applied to implementation of an operation to rewrite data into the memory in the event of such deterioration.

In this way, the determination of data rates can be applied to a broad range of applications. The method of determining error rates can be implemented by hardware as well as software executed by a computer system.

The cumulative addition of error-absence detection signals and error-presence detection signals described above can be carried out in an analog way in place of the digital counter circuit described above. For example, a charge pump circuit is used. In this case, the aforementioned carry signal is cumulatively stored in a capacitor as electric charge of a predetermined amount. On the other hand, the aforementioned borrow signal is used for discharging electric charge of a large amount corresponding to the error rate from the capacitor. As an alternative, an analog processing circuit generates a unit voltage representing the carry signal and cumulatively adds the unit voltage to the voltage of electric charge stored in the capacitor. In the case of a borrow signal, on the other hand, the analog processing circuit generates a subtraction voltage as a result of multiplication of the unit voltage by a factor corresponding to the error rate, and subtracts the subtraction voltage from the voltage of electric charge stored in the capacitor.

In the case of a dynamic RAM to which the present invention is applied, the so-called folded bit line (2-intersection) technique is adopted in the configuration of the memory cell array of the dynamic RAM. In this folded bit line technique, mutually complementary parallel bit lines are stretched. As an alternative, the so-called open bit line (1-intersection) technique can also be adopted. With this technique, mutually complementary bit lines are stretched with a sense amplifier placed between the bit lines.

The present invention can be applied to a method of determining an error rate in a system for transferring and storing various kinds of data as well as a broad range of semiconductor integrated circuit devices adopting the method. The semiconductor integrated circuit devices include a system LSI including a DRAM, a DRAM memory module, a variety of DRAMs such as a multi-chip module memory and a stacked CSP memory, a variety of memory circuits and a data transfer circuit.

Representative effects of the present invention disclosed in this specification are briefly described as follows. Detection of an error is carried out on a plurality of pieces of data by using the pieces of data and inspection bits generated for the pieces of data. If no error is detected, a first detection signal is accumulated in a first direction, that is, the first detection signal is added to a sum. If an error is detected, on the other hand, a second detection signal is accumulated in a second direction, that is, the second direction signal is multiplied by a weight to give a product before subtracting the product from the sum wherein the weight is large enough to result in a value of the product corresponding to a desired error rate. The sum obtained as a result of accumulation in the first and second directions is used to accurately evaluate an error rate for data processed so far.

In order to implement information sustaining operations realizing small power consumption and yet assuring high reliability, there is provided an error rate select circuit activated in an information sustaining mode, wherein a plurality of pieces of data is read out from a memory circuit comprising dynamic memory cells whereas inspection bits for detection and correction of an error existing in the pieces of data are generated. The inspection bits stored in an additional memory circuit. An ECC circuit reads out the pieces of data from the memory circuit and the inspection bits associated with the pieces of data from the additional memory circuit to detect and correct an error at fixed refresh intervals. If no error is detected, a first detection signal is accumulated in a first direction, that is, the first detection signal is added to a sum. If an error is detected, on the other hand, a second detection signal is accumulated in a second direction, that is, the second direction signal is multiplied by a weight to give a product before subtracting the product from the sum wherein the weight is large enough to result in a value of the product greater than the first detection signal. If the sum increases in the first direction, exceeding a predetermined value, the refresh period is lengthened by a predetermined incremental time. If the sum decreases in the second direction, becoming smaller than another predetermined value, on the other hand, the refresh period is shortened by a predetermined decremental time.

What is claimed is:

1. An error rate determining method which determines an error rate of a semiconductor memory device which implements detection of an error existing in a plurality of pieces of data stored in said semiconductor memory device by using said pieces of data and inspection bits provided for said pieces of data, said error rate determining method comprising:
   cumulatively adding a first predetermined value to a total value in the event of detecting a first detection signal indicating non-existence of an error in said pieces of data;
   subtracting a second predetermined value greater than said first predetermined value from said total value in the event of detecting a second detection signal indicating existence of an error in said pieces of data; and
   determining said error rate based on said total value.

2. An error rate determining method according to claim 1, wherein said pieces of data and said inspection bits are read from a memory circuit.

3. An error rate determining method for a semiconductor memory circuit device having a primary memory circuit and a secondary memory circuit, wherein said primary memory circuit comprises dynamic memory cells, said error rate determining method comprising:
   performing a first operation in which when an information sustaining mode is set, a plurality of pieces of data are read from said primary memory circuit to generate inspection bits, and in which the generated inspection bits are stored in said secondary memory circuit;
   performing, in a fixed cycle, a second operation in which said pieces of data are read from said primary memory circuit and said inspection bits are read from said secondary memory circuit to detect whether an error exists in said pieces of data;
   adding a first predetermined value to a total value when an error is not detected in said second operation;
   subtracting a second predetermined value greater than said first predetermined value from said total value when an error is detected in said second operation; and
   adjusting said fixed cycle according to said total value to set an error rate.

4. An error rate determining method according to claim 3, wherein said fixed cycle is a refresh cycle for said dynamic memory cells.

* * * * *